(12) United States Patent
Ishihara

(10) Patent No.: US 10,566,674 B2
(45) Date of Patent: Feb. 18, 2020

(54) DIRECTIONAL COUPLER AND COMMUNICATION UNIT

(71) Applicant: Murata Manufacturing Co., Ltd., Kyoto (JP)

(72) Inventor: Shota Ishihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/139,130

(22) Filed: Sep. 24, 2018

(65) Prior Publication Data

US 2019/0097297 A1 Mar. 28, 2019

(30) Foreign Application Priority Data

Sep. 25, 2017 (JP) ................. 2017-184015

(51) Int. Cl.
| | | |
|---|---|---|
| H01P 5/18 | (2006.01) | |
| H04B 1/00 | (2006.01) | |
| H03H 7/01 | (2006.01) | |
| H03H 7/48 | (2006.01) | |
| H03F 3/189 | (2006.01) | |
| H04B 1/16 | (2006.01) | |
| H01Q 1/24 | (2006.01) | |

(52) U.S. Cl.
CPC ............. *H01P 5/18* (2013.01); *H01Q 1/247* (2013.01); *H03F 3/189* (2013.01); *H03H 7/0115* (2013.01); *H03H 7/0161* (2013.01); *H03H 7/485* (2013.01); *H04B 1/0053* (2013.01); *H04B 1/16* (2013.01); *H03F 2200/165* (2013.01); *H03F 2200/294* (2013.01); *H03F 2200/451* (2013.01)

(58) Field of Classification Search
CPC ...... H01P 5/18; H03H 7/0161; H03H 7/0115; H03H 7/485; H03F 3/189; H03F 2200/451; H03F 2200/294; H03F 2200/165; H04B 1/16; H04B 1/0053; H01Q 1/247
USPC ........................................................ 455/271
See application file for complete search history.

(56) References Cited

U.S. PATENT DOCUMENTS

| | | | | |
|---|---|---|---|---|
| 2009/0289744 | A1* | 11/2009 | Miyashiro | ............ H03H 7/0115 333/175 |
| 2015/0155848 | A1 | 6/2015 | Yazaki | |
| 2018/0048046 | A1 | 2/2018 | Noguchi et al. | |

FOREIGN PATENT DOCUMENTS

| | | |
|---|---|---|
| WO | 2014/030469 A1 | 2/2014 |
| WO | 2016/158314 A1 | 10/2016 |

\* cited by examiner

*Primary Examiner* — Lee Nguyen
(74) *Attorney, Agent, or Firm* — Pearne & Gordon LLP

(57) ABSTRACT

A directional coupler includes a main line through which a first signal in a first frequency band and a second signal in a second frequency band pass from a first port to a second port, a sub-line electromagnetically coupled to the main line and having a third port and a fourth port, the third port outputting a first coupled signal corresponding to the first signal and a second coupled signal corresponding to the second signal, a first termination circuit connected to the fourth port and used in outputting the first coupled signal, a second termination circuit connected to the fourth port and used in outputting the second coupled signal, and a first filter circuit disposed between the fourth port and the first termination circuit, wherein the first filter circuit has frequency characteristics allowing the first coupled signal to pass therethrough and attenuating the second coupled signal.

18 Claims, 20 Drawing Sheets

DIRECTIONAL COUPLER AND COMMUNICATION UNIT

This application claims priority from Japanese Patent Application No. 2017-184015 filed on Sep. 25, 2107. The content of this application is incorporated herein by reference in its entirety.

The present disclosure relates to a directional coupler and a communication unit. In a mobile communication device such as a cellular phone, a directional coupler is disposed, for example, between an amplifier for a transmitted signal and an antenna. International Publication No. 2016/158314, for example, discloses a directional coupler including a main line that serves as a transfer path for an RF (Radio-Frequency) signal, a sub-line coupled to the main line, and a termination portion including a plurality of elements and disposed at one port of the sub-line. In the disclosed directional coupler, a termination condition of the termination portion is adjusted and directivity of the directional coupler is improved by optionally switching over connections of the elements included in the termination portion depending on a frequency of the RF signal.

Recently, a technique for transmitting and receiving RF signals in a plurality of different frequency bands at the same time in the mobile communication device has been developed as represented in the so-called carrier aggregation technology. In the directional coupler disclosed in International Publication No. 2016/158314, however, the following problem arises because the connections of the elements included in the termination portion are switched over in accordance with turning-on/off of switches. With the configuration of the disclosed directional coupler, when the RF signals in the plurality of different frequency bands are supplied to the main line at the same time, the termination condition of a termination circuit cannot be adjusted depending on the frequency bands of the individual RF signals, thus resulting in a possibility that the directivity may degrade.

BRIEF SUMMARY

In view of the above-described situation, the present disclosure provides a directional coupler and a communication unit in which directivity can be improved for signals in a plurality of different frequency bands at the same time.

According to an embodiment of the present disclosure, there is provided a directional coupler including a main line through which a first signal in a first frequency band and a second signal in a second frequency band pass from a first port to a second port, a sub-line electromagnetically coupled to the main line and having a third port and a fourth port, the third port outputting a first coupled signal corresponding to the first signal and a second coupled signal corresponding to the second signal, a first termination circuit connected to the fourth port and used in outputting the first coupled signal, a second termination circuit connected to the fourth port and used in outputting the second coupled signal, and a first filter circuit disposed between the fourth port and the first termination circuit, wherein the first filter circuit has frequency characteristics allowing the first coupled signal to pass therethrough and attenuating the second coupled signal.

According to the present disclosure, the directional coupler and the communication unit can be obtained in which directivity can be improved for the signals in the plurality of different frequency bands at the same time.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described in detail below with reference to the drawings. It is to be noted that the same elements are denoted by the same reference signs, and duplicate description of those elements is omitted.

Figure 1:
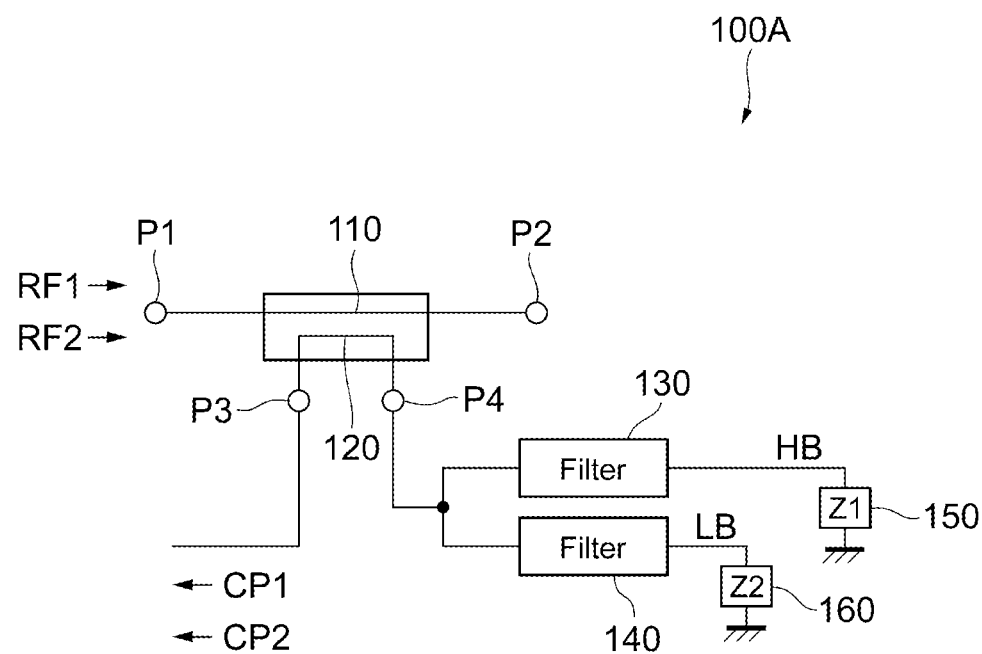
FIG. 1 is a block diagram illustrating an example of configuration of a directional coupler according to a first embodiment of the present disclosure.

FIG. 1 is a block diagram illustrating an example of configuration of a directional coupler according to a first embodiment of the present disclosure. A directional coupler 100A illustrated in FIG. 1 is mounted on a mobile communication device such as a cellular phone and is used to detect a signal level of an RF (Radio-Frequency) signal transmitted to a base station. The directional coupler 100A is further used to distribute a transmitted signal that is transmitted to the base station, and a received signal that is received from the base station. The directional coupler 100A is targeted for signals according to communication standards such as 2G (second generation mobile communication system), 3G (third generation mobile communication system), 4G (fourth generation mobile communication system), 5G (fifth generation mobile communication system), LTE (Long Term Evolution)-FDD (Frequency Division Duplex), LTE-TDD (Time Division Duplex), LTE-Advanced, and LTE-Advanced Pro, for example. A frequency range of the RF signal is, for example, about several hundred MHz to several GHz. In addition, as described later, the directional coupler 100A is adaptable for the carrier aggregation technology and is able to couple RF signals in a plurality of different frequency bands and to output those RF signals at the same time. The communication standards and the frequency range of the signals targeted by the directional coupler 100A are not limited to the above-mentioned ones.

More specifically, the directional coupler 100A includes, for example, a main line 110, a sub-line 120, filter circuits 130 and 140, termination circuits 150 and 160, and ports P1 to P4.

The main line 110 is a line through which RF signals in different frequency bands pass from the port P1 (first port) to the port P2 (second port). The RF signals may be, for example, transmitted signals after being amplified by a power amplifier (not illustrated) or received signals having been received by an antenna. Although the frequency bands of the RF signals supplied to the main line 110 are not limited to particular ones, the following description is made, by way of example, on an assumption that a signal RF1 (first signal) in a frequency band (first frequency band) falling within a high band and a signal RF2 (second signal) in a frequency band (second frequency band) falling within a low band are supplied. The signal RF1 in the high band and the signal RF2 in the low band may be supplied to the main line 110 at the same time. In some cases, reflected signals of the signals RF1 and RF2 may be supplied to the main line 110 in a direction toward the port P1 from the port P2. The above-described combination of the frequency bands of the signals supplied to the main line 110 is merely illustrative, and the combined frequency bands are not limited to the high band and the low band. In another example, signals in the high band and a middle band may be supplied to the main line 110 instead of the signals in the high band and the low band.

The sub-line 120 is a line electromagnetically coupled to the main line 110 and constituting the coupler together with the main line 110. The sub-line 120 has a port P3 (third port) corresponding to the port P1, and a port P4 (fourth port) corresponding to the port P2. A coupled signal CP1 (first coupled signal) corresponding to the signal RF1 in the high band and a coupled signal CP2 (second coupled signal) corresponding to the signal RF2 in the low band are output from the port P3. Various types of processing are carried out on the coupled signals CP1 and CP2, which have been output from the port P3, in circuits subsequent to the directional coupler 100A. Though not illustrated in FIG. 1, for example, a detection circuit of detecting a signal level may be disposed subsequent to the port P3.

The filter circuit 130 (first filter circuit) is disposed between the port P4 and the termination circuit 150. The filter circuit 130 has frequency characteristics allowing the high-band coupled signal CP1 to pass therethrough and attenuating the low-band coupled signal CP2. On the other hand, the filter circuit 140 (second filter circuit) is disposed between the port P4 and the termination circuit 160. The filter circuit 140 has frequency characteristics allowing the low-band coupled signal CP2 to pass therethrough and attenuating the high-band coupled signal CP1. Thus, in the directional coupler 100A, even when the signals RF1 and RF2 in the plurality of different frequency bands are supplied to the main line 110 at the same time, the coupled signals CP1 and CP2 are distributed through the filter circuits 130 and 140 depending on the frequency bands and are terminated by the termination circuits 150 and 160, respectively.

The termination circuit 150 (first termination circuit) has a predetermined impedance value Z1 and connects the port P4 to a ground via the filter circuit 130. The termination circuit 150 is used in outputting the high-band coupled signal CP1. On the other hand, the termination circuit 160 (second termination circuit) has a predetermined impedance value Z2 and connects the port P4 to the ground via the filter circuit 140. The termination circuit 160 is used in outputting the low-band coupled signal CP2.

Here, reflected signals of the leaked RF signals RF1 and RF2 are also output to the port P3 in addition to the coupled signals CP1 and CP2. Moreover, the coupled signals CP1 and CP2 are reflected by the ground after passing through the filter circuits 130 and 140 and the termination circuits 150 and 160 from the port P4 and are then returned to the port P4. Resulting return signals are further supplied to the port P3. Accordingly, the impedance values Z1 and Z2 of the termination circuits 150 and 160 can be set to values at which phases of the reflected signals leaking to the port P3 and phases of the return signals are opposite to each other. Hereinafter, the impedance values satisfying that condition are also called "proper impedance values". When the termination circuits 150 and 160 have the proper impedance values, the reflected signals leaking to the port P3 are cancelled by the return signals, and isolation (dB) is improved. Thus, directivity (dB), i.e., an index represented by a value resulting from subtracting a coupling degree from the isolation, is also improved.

The proper impedance value is different depending on the frequency of each signal passing through a path for the termination. In particular, because of the isolation and a band width of the frequency band being in a trade-off relation, if the signals in the plurality of different frequency bands share one termination circuit, degradation of the isolation becomes more significant as the frequencies of those signals are more apart from each other.

In this embodiment, with the provision of the filter circuits 130 and 140 as described above, the coupled signals CP1 and CP2 can be distributed depending on frequencies and supplied to the paths including the termination circuits 150 and 160 without necessarily resorting to turning-on/off of switches. Hence the impedance values Z1 and Z2 of the termination circuits 150 and 160 can be set to the proper impedance values depending on frequencies. As a result, even when the signals in the different frequency bands are supplied to the main line 110 at the same time as in the case of carrier aggregation, directivity of each of the signals in the frequency bands can be improved.

Furthermore, in this embodiment, since the directional coupler is constituted without necessarily using any active elements, such as switches, unlike the configuration disclosed in International Publication No. 2016/158314, the manufacturing cost can be reduced.

While FIG. 1 illustrates an example in which the directional coupler 100A is targeted for the signals RF1 and RF2 in two frequency bands, the number of frequency bands of the signals targeted by the directional coupler 100A may be three or more. In such a case, it is just required to increase the number of combinations of the filter circuits and the termination circuits corresponding to the number of the frequency bands.

Figure 2:
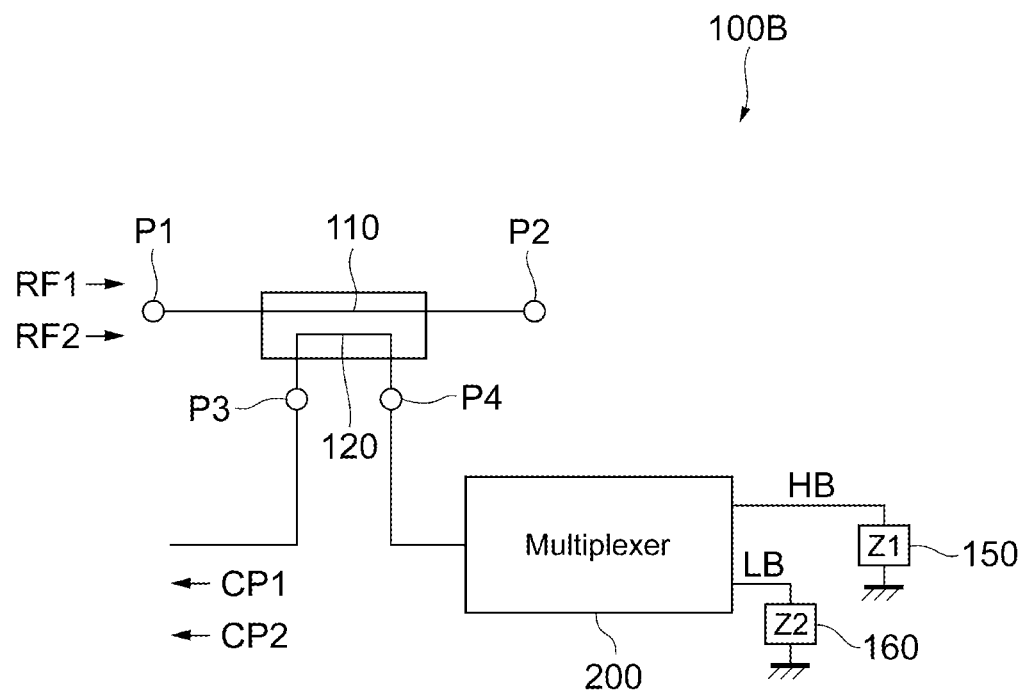
FIG. 2 is a block diagram illustrating an example of configuration of a directional coupler according to a second embodiment of the present disclosure.

FIG. 2 is a block diagram illustrating an example of configuration of a directional coupler according to a second embodiment of the present disclosure. The same elements as those in the directional coupler 100A illustrated in FIG. 1 are denoted by the same reference signs, and description of those elements is omitted. Furthermore, in embodiments described below, description of matters common to those in the directional coupler 100A is omitted, and only different points are described. In particular, similar operations and advantageous effects obtained with similar configurations are not described in each of the embodiments.

A directional coupler 100B illustrated in FIG. 2 is different from the directional coupler 100A in including a multiplexer 200 instead of the filter circuits 130 and 140.

The multiplexer 200 (first filter circuit) is disposed between the port P4 and the termination circuits 150 and 160. The multiplexer 200 has frequency characteristics allowing the high-band coupled signal CP1 to pass therethrough and attenuating the low-band coupled signal CP2 between the port P4 and the termination circuit 150. In addition, the multiplexer 200 has frequency characteristics allowing the low-band coupled signal CP2 to pass therethrough and attenuating the high-band coupled signal CP1 between the port P4 and the termination circuit 160.

With the configuration described above, the directional coupler 100B can also provide similar advantageous effects to those obtained in the directional coupler 100A. A duplexer may be used instead of the multiplexer.

Figure 3:
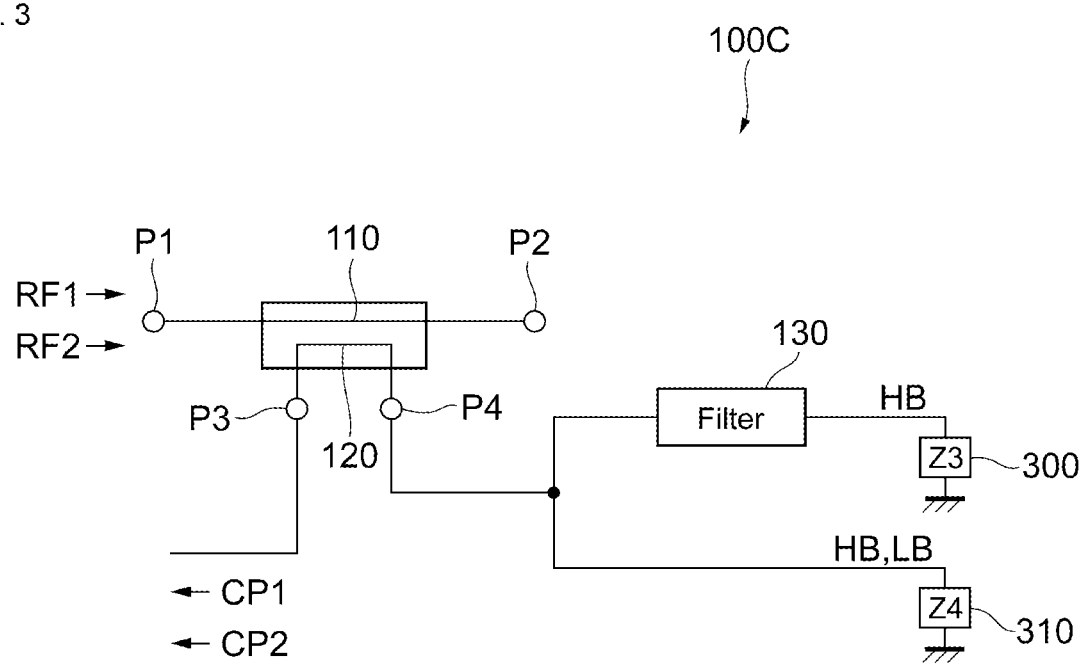
FIG. 3 is a block diagram illustrating an example of configuration of a directional coupler according to a third embodiment of the present disclosure.

FIG. 3 is a block diagram illustrating an example of configuration of a directional coupler according to a third embodiment of the present disclosure. A directional coupler 100C illustrated in FIG. 3 is different from the directional coupler 100A illustrated in FIG. 1 in not including the filter circuit 140 but including termination circuits 300 and 310 instead of the termination circuits 150 and 160.

The filter circuit 130 (first filter circuit) has, as described above, the frequency characteristics allowing the high-band coupled signal CP1 to pass therethrough and attenuating the low-band coupled signal CP2. Accordingly, the high-band coupled signal CP1 is supplied to the path on the side where the termination circuit 300 (first termination circuit) is disposed, but the low-band coupled signal CP2 is not supplied to that path. On the other hand, the high-band coupled signal CP1 and the low-band coupled signal CP2 are both supplied to the path on the side where the termination circuit 310 (second termination circuit) is disposed.

Thus, the termination circuit 300 is used in outputting only the high-band coupled signal CP1. The termination circuit 310 is used in outputting both the high-band coupled signal CP1 and the low-band coupled signal CP2. Accordingly, the impedance value Z4 of the termination circuit 310 needs to be the proper impedance value for the low-band coupled signal CP2. On the other hand, the impedance value Z3 of the termination circuit 300 needs to be set such that a combined value of the impedance value Z3 of the termination circuit 300 and the impedance value Z4 of the termination circuit 310 is the proper impedance value for the high-band coupled signal CP1.

With the configuration described above, the directional coupler 100C can also provide similar advantageous effects to those obtained in the directional coupler 100A. In addition, since the directional coupler 100C does not include the filter circuit 140 unlike the directional coupler 100A, the directional coupler 100C can be constituted by a smaller number of elements.

While this embodiment has been described in connection with the configuration in which the directional coupler 100C includes the filter circuit 130 allowing passage of the high band therethrough, the directional coupler 100C may have a configuration including, instead of the filter circuit 130, the filter circuit 140 allowing passage of the low band therethrough.

Figure 4:
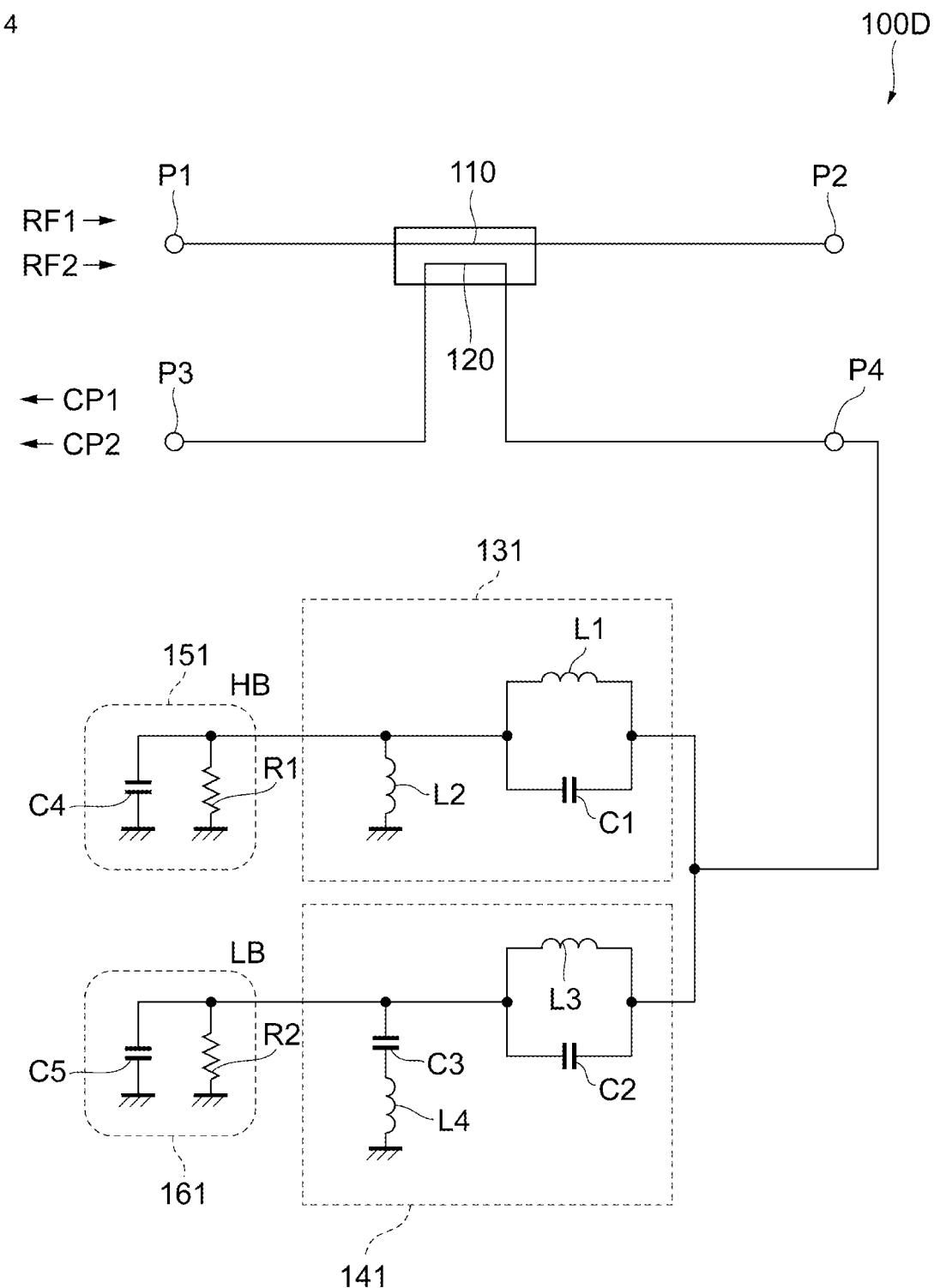
FIG. 4 is a block diagram illustrating an example of configuration of a directional coupler according to a fourth embodiment of the present disclosure.

FIG. 4 is a block diagram illustrating an example of configuration of a directional coupler according to a fourth embodiment of the present disclosure. A directional coupler 100D illustrated in FIG. 4 represents practical examples (filter circuits 131 and 141 and termination circuits 151 and 161) of the configurations of the filter circuits 130 and 140 and the termination circuits 150 and 160 illustrated in FIG. 1.

The filter circuit 131 includes inductors L1 and L2 and a capacitor C1. The inductor L1 and the capacitor C1 are connected in parallel and constitute an LC parallel resonance circuit. This LC parallel resonance circuit is connected in series between the port P4 and the termination circuit 151. The constants of the inductor L1 and the capacitor C1 are set such that a resonant frequency of the above LC parallel resonance circuit falls in the frequency band of the low band to be attenuated. With that setting, the filter circuit 131 has a very high impedance (ideally becomes open) for a low-band signal and can attenuate the low-band coupled signal CP2. The inductor L2 is connected between an output of the LC parallel resonance circuit and the ground, and it further attenuates the low-band signal.

The filter circuit 141 includes inductors L3 and L4 and capacitors C2 and C3. The inductor L3 and the capacitor C2 are connected in parallel and constitute an LC parallel resonance circuit. This LC parallel resonance circuit is connected in series between the port P4 and the termination circuit 161. The constants of the inductor L3 and the capacitor C2 are set such that a resonant frequency of the above LC parallel resonance circuit falls in the frequency band of the high band to be attenuated. With that setting, the filter circuit 141 has a very high impedance (ideally becomes open) for a high-band signal and can attenuate the high-band coupled signal CP1. The inductor L4 and the capacitor C3 are connected in series and constitute an LC series resonance circuit. This LC series resonance circuit is connected between an output of the LC parallel resonance circuit and the ground, and it further attenuates the high-band signal. RF signals can be attenuated over a wider band, for example, by setting a resonant frequency of the LC series resonance circuit to a higher frequency than a fundamental wave of the high band.

The termination circuit 151 includes a resistance element R1 and a capacitor C4. The resistance element R1 and the capacitor C4 are each connected between an output of the filter circuit 131 and the ground. The constants of the resistance element R1 and the capacitor C4 are set such that a combined impedance value Z1 of the resistance element R1 and the capacitor C4 becomes a proper value.

The termination circuit 161 includes a resistance element R2 and a capacitor C5. The resistance element R2 and the capacitor C5 are each connected between an output of the filter circuit 141 and the ground. The constants of the resistance element R2 and the capacitor C5 are set such that a combined impedance value Z2 of the resistance element R2 and the capacitor C5 becomes a proper value.

With the configuration described above, the directional coupler 100C can also provide similar advantageous effects to those obtained in the directional coupler 100A.

The above-described configurations of the filter circuits 131 and 141 and the termination circuits 151 and 161 are merely examples, and the circuit configurations are not limited to them. For instance, an LC series resonance circuit may be used in the filter circuit 131 instead of the inductor L2, and an inductor may be used in the filter circuit 141 instead of the LC series resonance circuit. In each of the termination circuits 151 and 161, a resonance circuit using an inductor and a capacitor, for example, may be used instead of the combination of the resistance element and the capacitor. In such a case, the isolation can be further improved by setting a resonant frequency of the resonance circuit to be matched with the frequency band of the signal to be passed.

Figure 5:
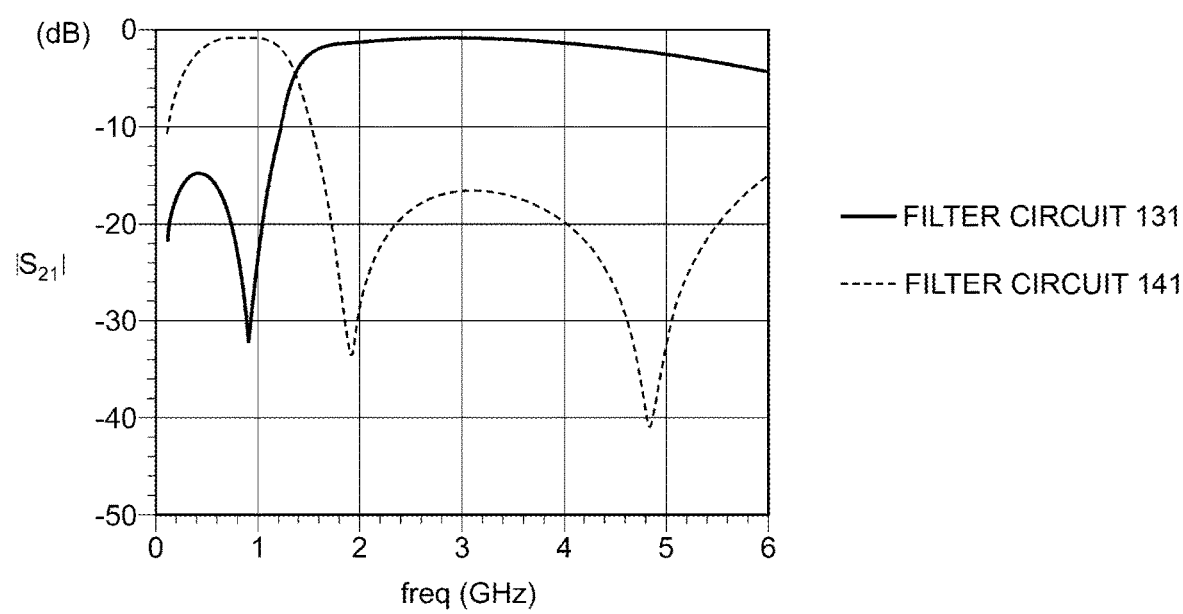
FIG. 5 is a graph depicting an example of simulation results of transfer characteristics of individual paths in the directional coupler according to the fourth embodiment of the present disclosure.

FIG. 5 is a graph depicting an example of simulation results of transfer characteristics of individual paths in the directional coupler according to the fourth embodiment of the present disclosure. The graph depicted in FIG. 5 represents the transfer characteristics (i.e., S (Scattering) parameter $S_{21}$) of the individual paths including the filter circuits 131 and 141 when a signal of frequencies ranging from the low band to the high band is supplied to the port P4 in the directional coupler 100D. Here, it is assumed that a frequency band of the supplied signal includes a low band of about 0.6 GHz to 1 GHz, a middle band of about 1.5 GHz to 2.7 GHz, and a high band of about 3.4 GHz to 3.8 GHz. In the graph of FIG. 5, the horizontal axis indicates frequency (GHz), and the vertical axis indicates transfer characteristics (dB). In a simulation conducted here, the constants of individual elements are set such that the signal supplied to the port P4 is divided to flow through two paths, i.e., a path corresponding to the high band and the middle band, and a path corresponding to the low band.

As depicted in FIG. 5, in the path including the filter circuit 131, the signal in the frequency band of the low band is greatly attenuated, while most of the signals in the frequency bands of the middle band and the high band pass. On the other hand, in the path including the filter circuit 141, most of the signal in the frequency band of the low band passes, while the signals in the frequency bands of the middle band and the high band are greatly attenuated. It is hence understood that the filter circuits 131 and 141 have the function of distributing the signals.

Figure 6A:
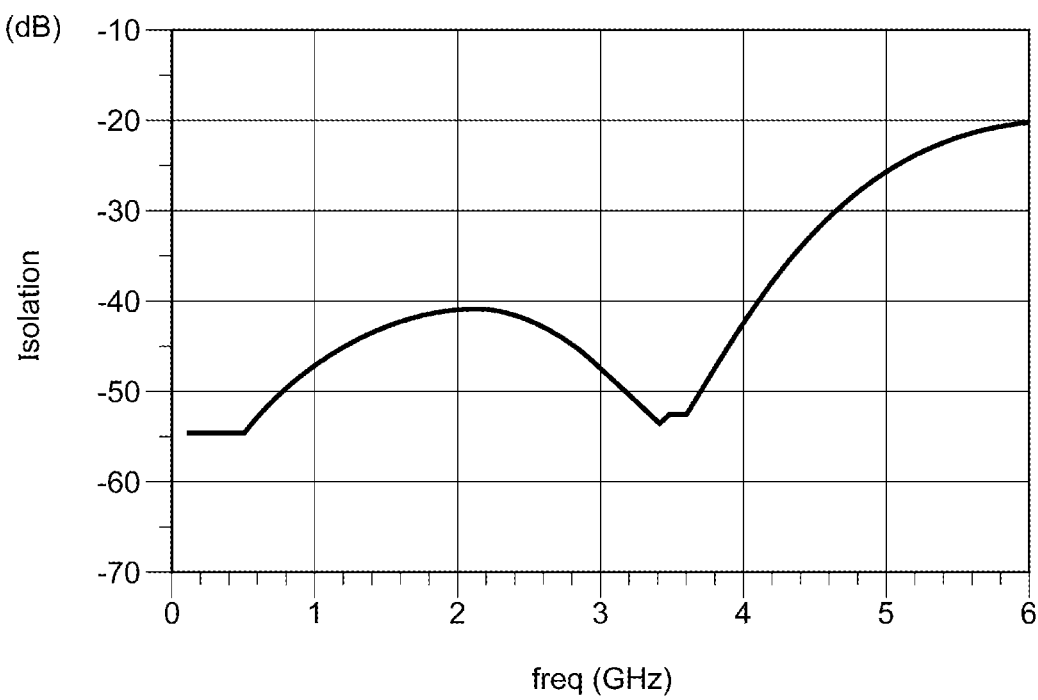
FIG. 6A is a graph depicting an example of a simulation result of isolation in a directional coupler according to a first comparative example.
Figure 6B:
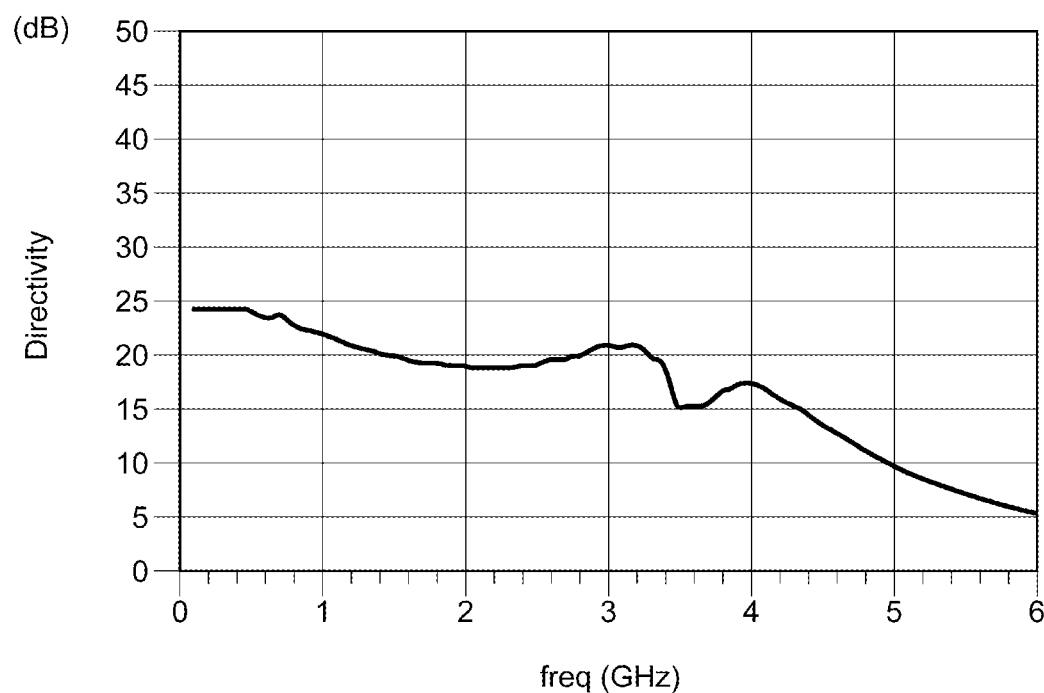
FIG. 6B is a graph depicting an example of a simulation result of directivity in the directional coupler according to the first comparative example.
Figure 7A:
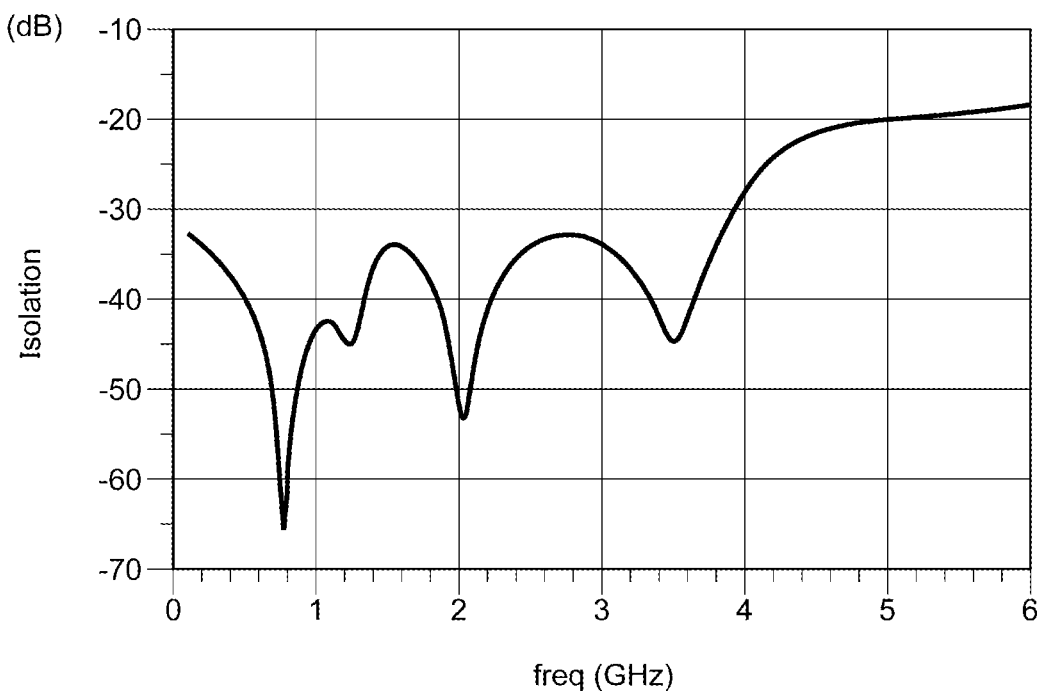
FIG. 7A is a graph depicting an example of a simulation result of isolation in the directional coupler according to the fourth embodiment of the present disclosure.
Figure 7B:
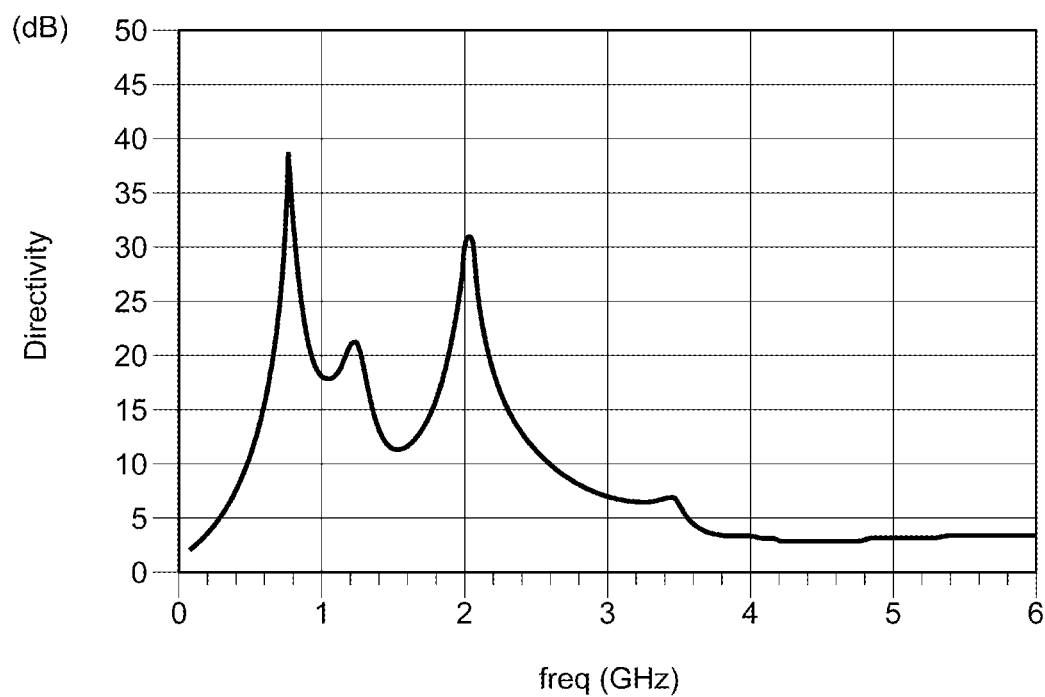
FIG. 7B is a graph depicting an example of a simulation result of directivity in the directional coupler according to the fourth embodiment of the present disclosure.

FIG. 6A is a graph depicting an example of a simulation result of isolation in the directional coupler according to a first comparative example, and FIG. 6B is a graph depicting an example of a simulation result of directivity in the directional coupler according to the first comparative example. FIG. 7A is a graph depicting an example of a simulation result of isolation in the directional coupler according to the fourth embodiment of the present disclosure, and FIG. 7B is a graph depicting an example of a simulation result of directivity in the directional coupler according to the fourth embodiment of the present disclosure. Here, the first comparative example has a configuration in which, unlike the directional coupler 100D, the filter circuits 131 and 141 and the termination circuits 151 and 161 are not disposed and the ports P1 to P4 are each terminated through a resistance element of 50Ω. In FIGS. 6A and 7A, the horizontal axis indicates frequency (GHz), and the vertical axis indicates isolation (dB) (i.e., a level of the reflected signals leaking to the port P3) of the directional coupler. In FIGS. 6B and 7B, the horizontal axis indicates frequency (GHz), and the vertical axis indicates directivity (dB) (i.e., a value resulting from subtracting a coupling degree from the isolation) of the directional coupler.

As seen from FIG. 6A, in the first comparative example, the isolation degrades down to about −40 dB particularly near 2 GHz, and a leak of the coupled signals attributable to reflected waves is comparatively large. Moreover, as seen from FIG. 6B, the directivity remains about 20 to 25 dB in the range of about 0.7 GHz to 3 GHz.

On the other hand, as seen from FIG. 7A, in the directional coupler 100D, the isolation is greatly improved, i.e., about −65 dB and −55 dB near 0.8 GHz included in the low band and near 2 GHz included in the middle band, respectively. Moreover, as seen from FIG. 7B, corresponding to the isolation, the directivity is also greatly improved in excess of about 30 dB near the above-mentioned frequencies. Those results are presumably obtained from the fact that the termination circuits 151 and 161 are set to the proper impedance values in the directional coupler 100D.

Figure 8:
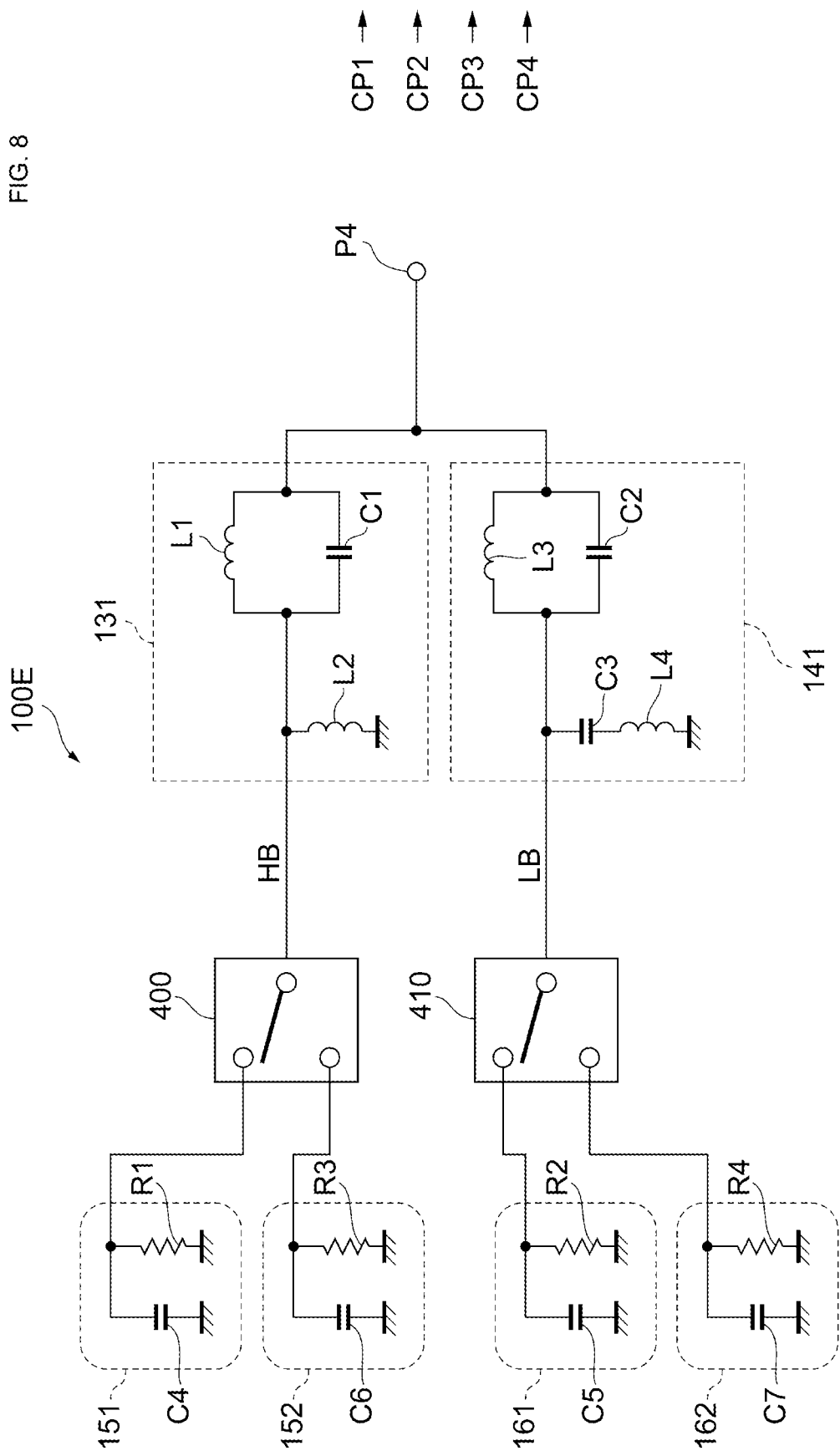
FIG. 8 is a block diagram illustrating an example of configuration of a directional coupler according to a fifth embodiment of the present disclosure.

FIG. 8 is a block diagram illustrating an example of configuration of a directional coupler according to a fifth embodiment of the present disclosure. A directional coupler 100E illustrated in FIG. 8 is different from the directional coupler 100D illustrated in FIG. 4 in further including termination circuits 152 and 162 and switch circuits 400 and 410. It is to be noted that FIG. 8 illustrates only the configuration downstream of the port P4 in the directional coupler 100E. This point is similarly applied to FIGS. 9 and 11 described later.

In this embodiment, a high-band signal RF3 (third signal) in a frequency band (third frequency band) different from that of the signal RF1, and a low-band signal RF4 (fourth signal) in a frequency band (fourth frequency band) different from that of the signal RF2 are further supplied to the main line (not illustrated in FIG. 8). In this case, a coupled signal CP3 (third coupled signal) corresponding to the high-band signal RF3 and a coupled signal CP4 (fourth coupled signal) corresponding to the low-band signal RF4 are output from the port P3 in addition to the coupled signals CP1 and CP2.

The termination circuit 152 (third termination circuit) is connected to the port P4 and is used when the high-band coupled signal CP3 is output from the port P3. An impedance value of the termination circuit 152 is set to the proper impedance value for the frequency band of the coupled signal CP3. On the other hand, the termination circuit 162

(fourth termination circuit) is connected to the port P4 and is used when the low-band coupled signal CP4 is output from the port P3. An impedance value of the termination circuit 162 is set to the proper impedance value for the frequency band of the coupled signal CP4. A resistance element R3 and a capacitor C6 included in the termination circuit 152 and a resistance element R4 and a capacitor C7 included in the termination circuit 162 have similar configurations to those in the termination circuits 151 and 161. Hence detailed description of those components is omitted.

The switch circuits 400 (first switch circuit) and 410 (second switch circuit) are each an SPDT (Single-Pole Double-Throw) switch. Depending on the frequency bands of the high-band coupled signals CP1 and CP3, the switch circuit 400 connects the port P4 to the termination circuit 151 when the coupled signal CP1 is to be output and connects the port P4 to the termination circuit 152 when the coupled signal CP3 is to be output. Depending on the frequency bands of the low-band coupled signals CP2 and CP4, the switch circuit 410 connects the port P4 to the termination circuit 161 when the coupled signal CP2 is to be output and connects the port P4 to the termination circuit 162 when the coupled signal CP4 is to be output.

With the configuration described above, the directional coupler 100E can also provide similar advantageous effects to those obtained in the directional coupler 100A. In addition, because of including the switch circuits 400 and 410, the directional coupler 100E can more finely set the impedance values of the termination circuits 151, 152, 161 and 162 than the directional coupler 100D. As a result, the directivity in each frequency band can be further improved.

Figure 9:
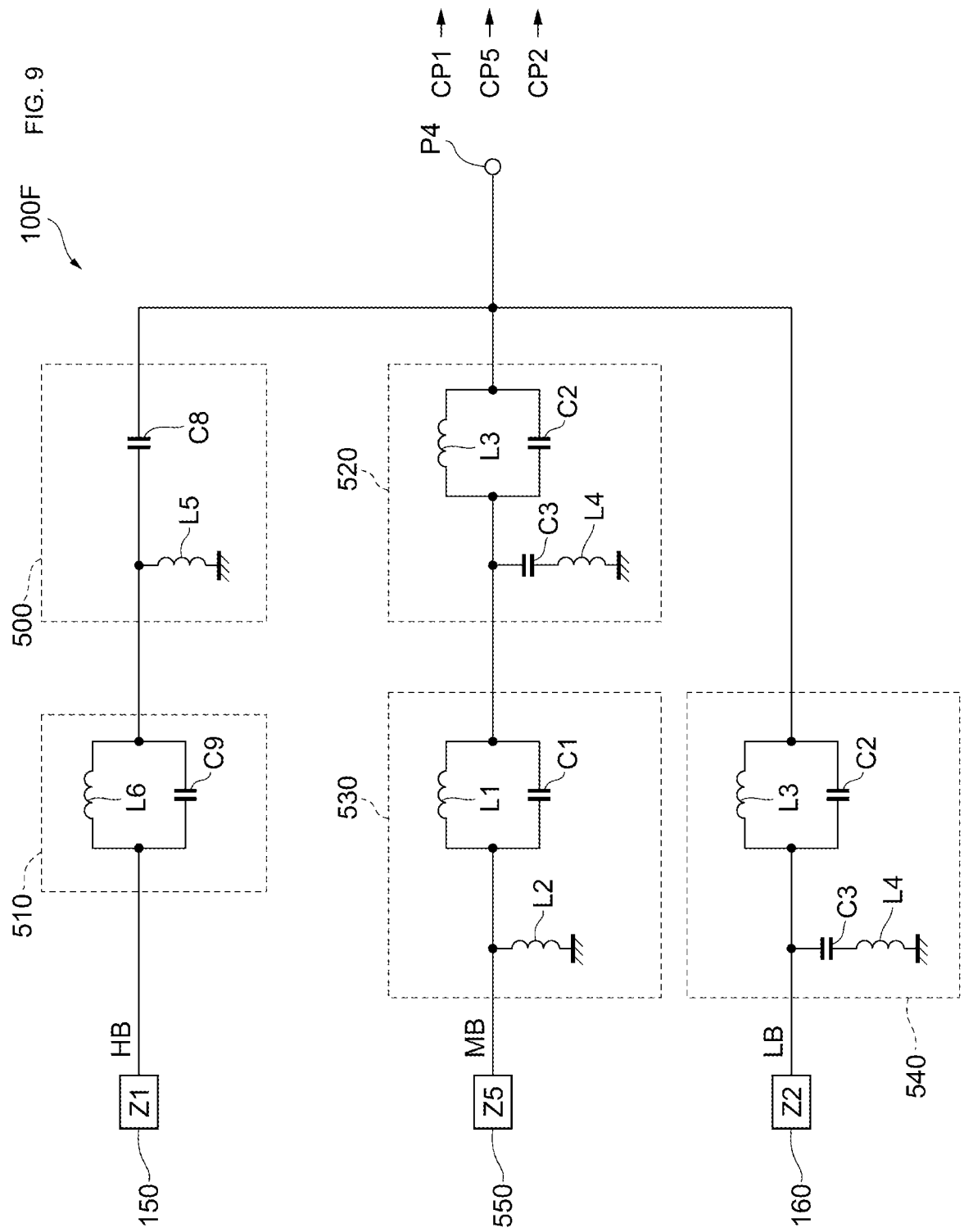
FIG. 9 is a block diagram illustrating an example of configuration of a directional coupler according to a sixth embodiment of the present disclosure.

FIG. 9 is a block diagram illustrating an example of configuration of a directional coupler according to a sixth embodiment of the present disclosure. A directional coupler 100F illustrated in FIG. 9 is different from the directional couplers 100A to 100E in that the directional coupler 100F is adaptable for a signal (third signal) in a frequency band (third frequency band) of the middle band in addition to the high band and the low band. This embodiment is described below on an assumption that a middle-band coupled signal CP5 (third coupled signal) is output from the port P3 in addition to the high-band coupled signal CP1 and the low-band coupled signal CP2.

More specifically, the directional coupler 100F includes, for example, filter circuits 500, 510, 520, 530 and 540, and the termination circuits 150, 160 and 550 downstream of the port P4. In the following, description of ones among the filter circuits 500 to 540, those ones having similar configurations of the filter circuits 131 and 141 illustrated in FIG. 4, are omitted for the sake of simplification of description while corresponding elements are denoted by the same reference signs. However, the same reference signs attached to the individual elements do not always imply that the constants of those elements are the same.

The filter circuits 500 and 510 are disposed between the port P4 and the termination circuit 150 (i.e., in a path through which the high-band coupled signal CP1 passes). The filter circuit 500 (first filter circuit) includes, for example, a capacitor C8 and an inductor L5. The capacitor C8 is connected in series to the line interconnecting the port P4 and the termination circuit 150, and the inductor L5 is connected between one output-side end of the capacitor C8 and the ground. With such a configuration, the filter circuit 500 functions as a high pass filter circuit that allows the high-band signal to pass therethrough, and that attenuates the middle-band signal and the low-band signal. The filter circuit 510 includes, for example, an inductor L6 and a capacitor C9. The inductor L6 and the capacitor C9 are connected in parallel and constitute an LC parallel resonance circuit. The constants of the inductor L6 and the capacitor C9 are set such that a resonant frequency of the LC parallel resonance circuit falls in the frequency band of the middle band to be attenuated. With that setting, the middle-band coupled signal CP5 can be further attenuated. Thus, only the high-band coupled signal CP1 is allowed to pass through the relevant path via the filter circuits 500 and 510.

The filter circuits 520 and 530 are disposed between the port P4 and the termination circuit 550 (i.e., in a path through which the middle-band coupled signal CP5 passes). The filter circuit 520 has a similar configuration to that of the filter circuit 141 illustrated in FIG. 4. The filter circuit 520 has frequency characteristics allowing the middle-band signal and the low-band signal to pass therethrough and attenuating the high-band signal. The filter circuit 530 has a similar configuration to that of the filter circuit 131 illustrated in FIG. 4. The filter circuit 530 has frequency characteristics allowing the high-band signal and the middle-band signal to pass therethrough and attenuating the low-band signal. Thus, only the middle-band coupled signal CP5 is allowed to pass through the relevant path via the filter circuits 520 and 530. The filter circuit 520 and the filter circuit 530 constitute one practical example of a third filter circuit in cooperation with each other.

The filter circuit 540 (second filter circuit) is disposed between the port P4 and the termination circuit 160 (i.e., in a path through which the low-band coupled signal CP2 passes). The filter circuit 540 has a similar configuration to that of the filter circuit 141 illustrated in FIG. 4. The filter circuit 540 has frequency characteristics allowing the low-band signal to pass therethrough and attenuating the high-band signal and the middle-band signal. Thus, only the low-band coupled signal CP2 is allowed to pass through the relevant path.

The termination circuit 550 (third termination circuit) is connected to the port P4 and is used when the middle-band coupled signal CP5 is output from the port P3. In other words, an impedance value Z5 of the termination circuit 550 is set to the proper impedance value for the frequency band of the coupled signal CP5.

With the configuration described above, because of including the filter circuits 500 to 540, the directional coupler 100F can distribute the coupled signals CP1, CP2 and CP5 depending on frequencies without necessarily using any switch elements and can supply those signals to the paths including the termination circuits 150, 160 and 550, respectively. As a result, the directional coupler 100F can improve the directivity of each of the signals in the three frequency bands.

The order in which the filter circuit 500 and the filter circuit 510 are arranged, and the order in which the filter circuit 520 and the filter circuit 530 are arranged are not limited to particular ones, and they may be reversed from the illustrated orders. The above-described configurations of the filter circuits 500 to 540 are merely illustrative, and the circuit configurations are not limited to them.

Figure 10:
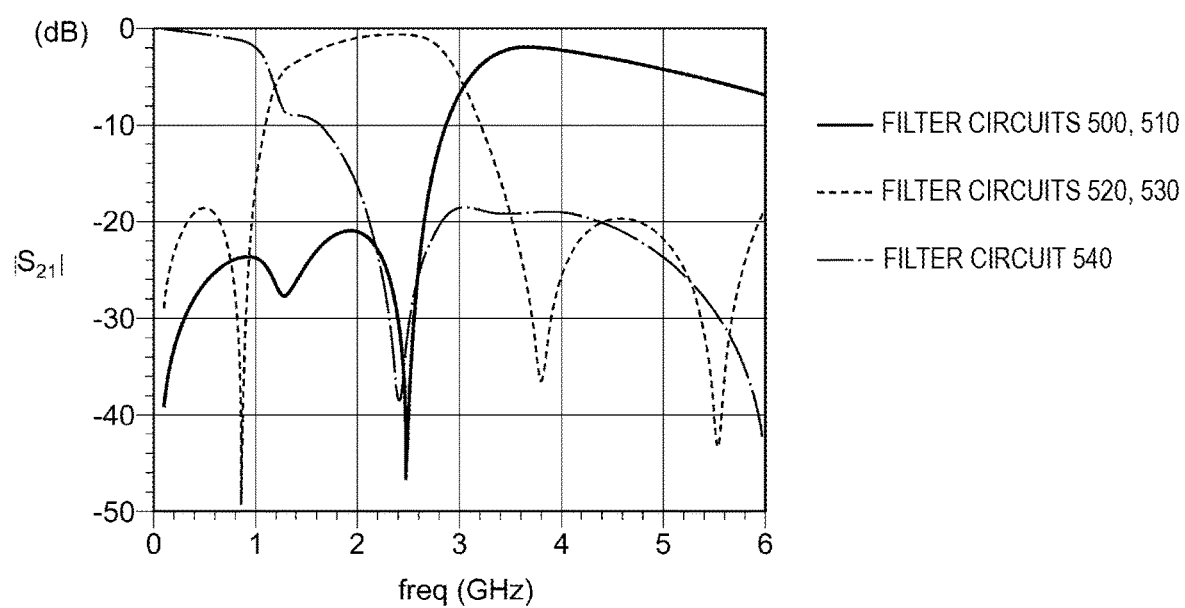
FIG. 10 is a graph depicting an example of simulation results of transfer characteristics of individual paths in the directional coupler according to the sixth embodiment of the present disclosure.

FIG. 10 is a graph depicting an example of simulation results of transfer characteristics of individual paths in the directional coupler according to the sixth embodiment of the present disclosure. The graph depicted in FIG. 10 represents the transfer characteristics of the individual paths when a signal of frequencies ranging from the low band to the high band is supplied to the port P4 in the directional coupler 100F. Here, it is assumed that a frequency band of the supplied signal includes a low band of about 0.6 GHz to 1

GHz, a middle band of about 1.5 GHz to 2.7 GHz, and a high band of about 3.4 GHz to 3.8 GHz. In the graph of FIG. 10, the horizontal axis indicates frequency (GHz), and the vertical axis indicates transfer characteristics (dB). In a simulation conducted here, the constants of individual elements of the filter circuits are set such that the signal supplied to the port P4 is divided to flow through three paths corresponding to the high band, the middle band, and the low band.

As depicted in FIG. 10, in the high-band path including the filter circuits 500 and 510, the signals in the frequency bands of the low band and the middle band are greatly attenuated, while most of the signal in the frequency band of the high band passes. In the middle-band path including the filter circuits 520 and 530, the signals in the frequency bands of the low band and the high band are greatly attenuated, while most of the signal in the frequency band of the middle band passes. In the low-band path including the filter circuit 540, the signals in the frequency bands of the high band and the middle band are greatly attenuated, while most of the signal in the frequency band of the low band passes. It is hence understood that the filter circuits 500 to 540 have the function of distributing the three frequency bands.

Figure 11:
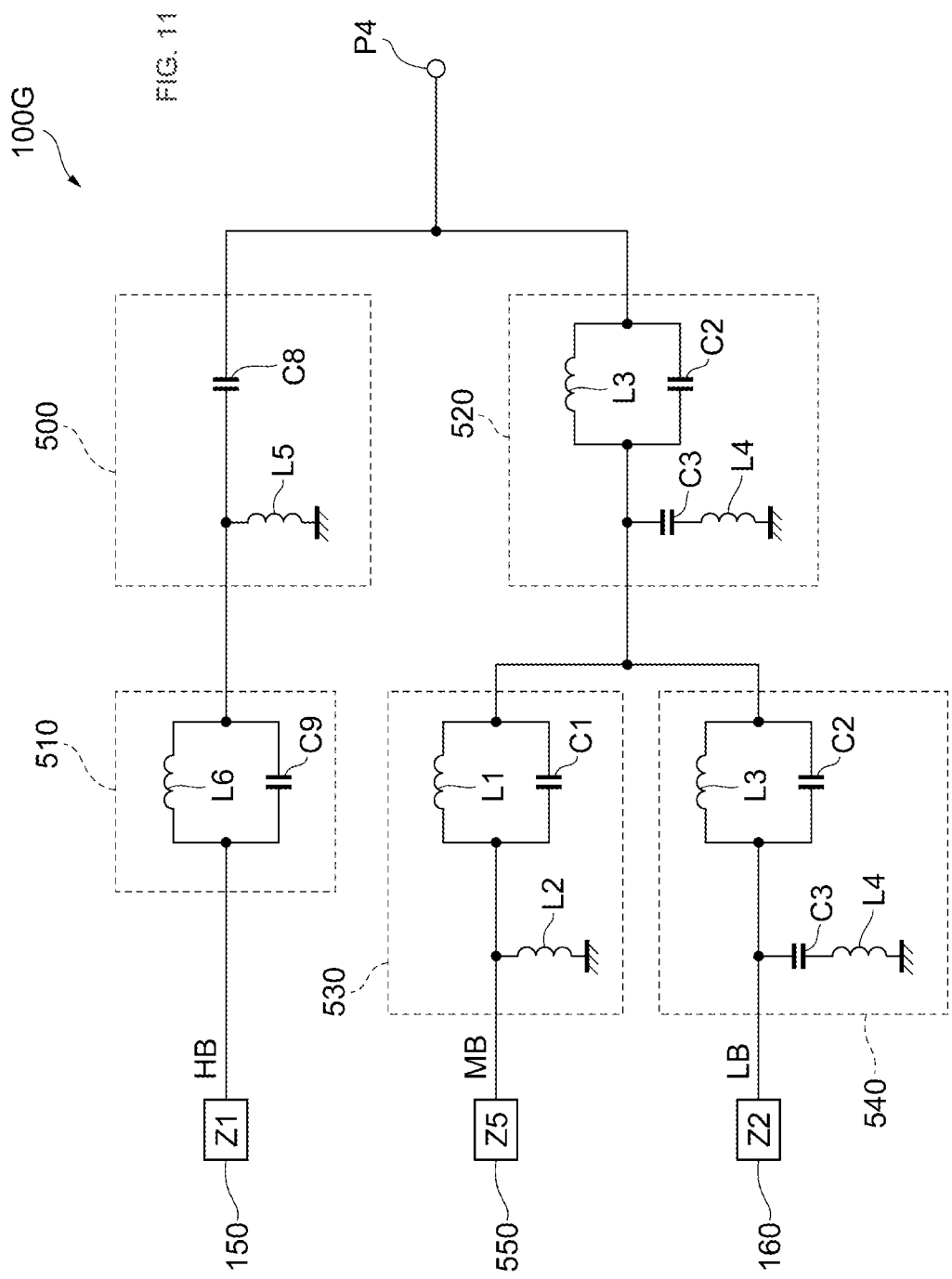
FIG. 11 is a block diagram illustrating an example of configuration of a directional coupler according to a seventh embodiment of the present disclosure.

FIG. 11 is a block diagram illustrating an example of configuration of a directional coupler according to a seventh embodiment of the present disclosure. A directional coupler 100G illustrated in FIG. 11 is adaptable for signals in three frequency bands as with the directional coupler 100F illustrated in FIG. 9, but it has a different path configuration from that of the directional coupler 100F.

More specifically, in the directional coupler 100G, the filter circuit 520 connected to the port P4 attenuates the high-band signal and allows the signals in the middle band and the low band to pass therethrough. The signals in the middle band and the low band output from the filter circuit 520 are further divided into the middle-band signal and the low-band signal through the filter circuit 530 and the filter circuit 540. Description of the path for the high band is omitted because it is similar to that in the directional coupler 100F.

Thus, a method of dividing a path depending on frequency bands is not limited to particular one. The three paths may be each directly connected to the port P4 as illustrated in FIG. 9, or the path may be branched in multiple stages from the port P4 as illustrated in FIG. 11.

With the configuration described above, the directional coupler 100G can also provide similar advantageous effects to those obtained in the directional coupler 100F. Moreover, in the directional coupler 100G, the low-band signal passes through the two filter circuits 520 and 540. Accordingly, the directional coupler 100G can further attenuate, in the low-band path, the signals in the other frequency bands without necessarily increasing the number of the filter circuits in comparison with the directional coupler 100F.

Figure 12:
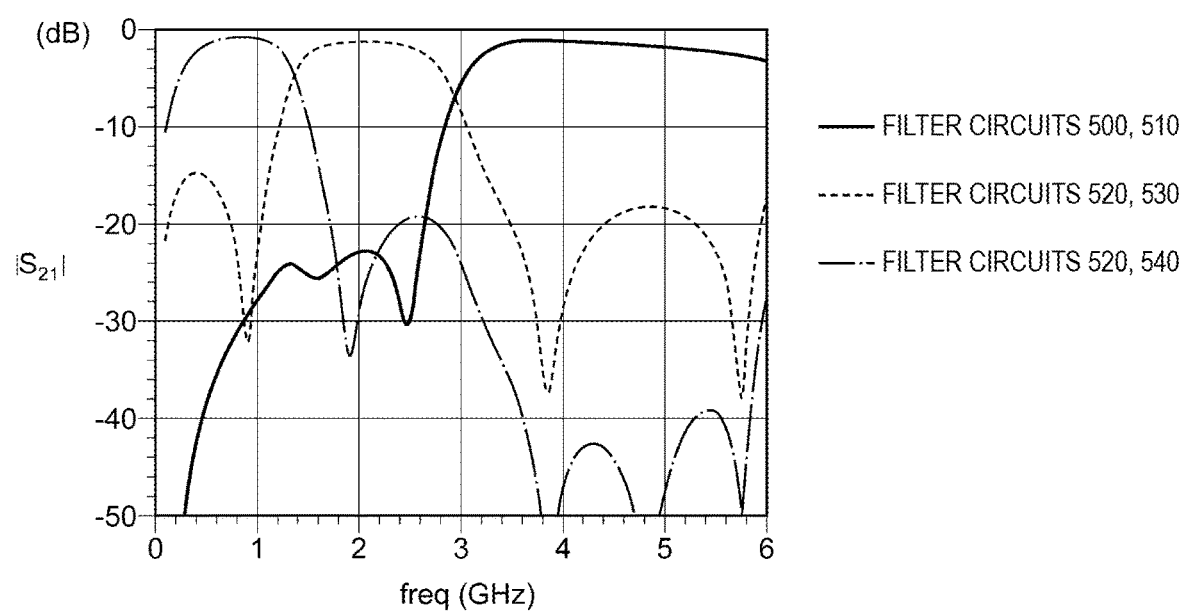
FIG. 12 is a graph depicting an example of simulation results of transfer characteristics of individual paths in the directional coupler according to the seventh embodiment of the present disclosure.

FIG. 12 is a graph depicting an example of simulation results of transfer characteristics of individual paths in the directional coupler according to the seventh embodiment of the present disclosure. The graph depicted in FIG. 12 represents the transfer characteristics of the individual paths, as in the graph of FIG. 10, when a signal of frequencies ranging from the low band to the high band is supplied to the port P4 in the directional coupler 100G.

As depicted in FIG. 12, the transfer characteristics of the paths for the high band and the middle band are not so different from those depicted in FIG. 10. On the other hand, in the transfer characteristics of the path for the low band, the attenuation is larger particularly in a range of not lower than about 3 GHz than that in FIG. 10. This is presumably attributable to the fact that, as described above, the low-band signal passes through the filter circuit 520 as well in this embodiment. It is hence understood that the filter circuits 500 to 540 have the function of distributing the three frequency bands.

Figure 13:
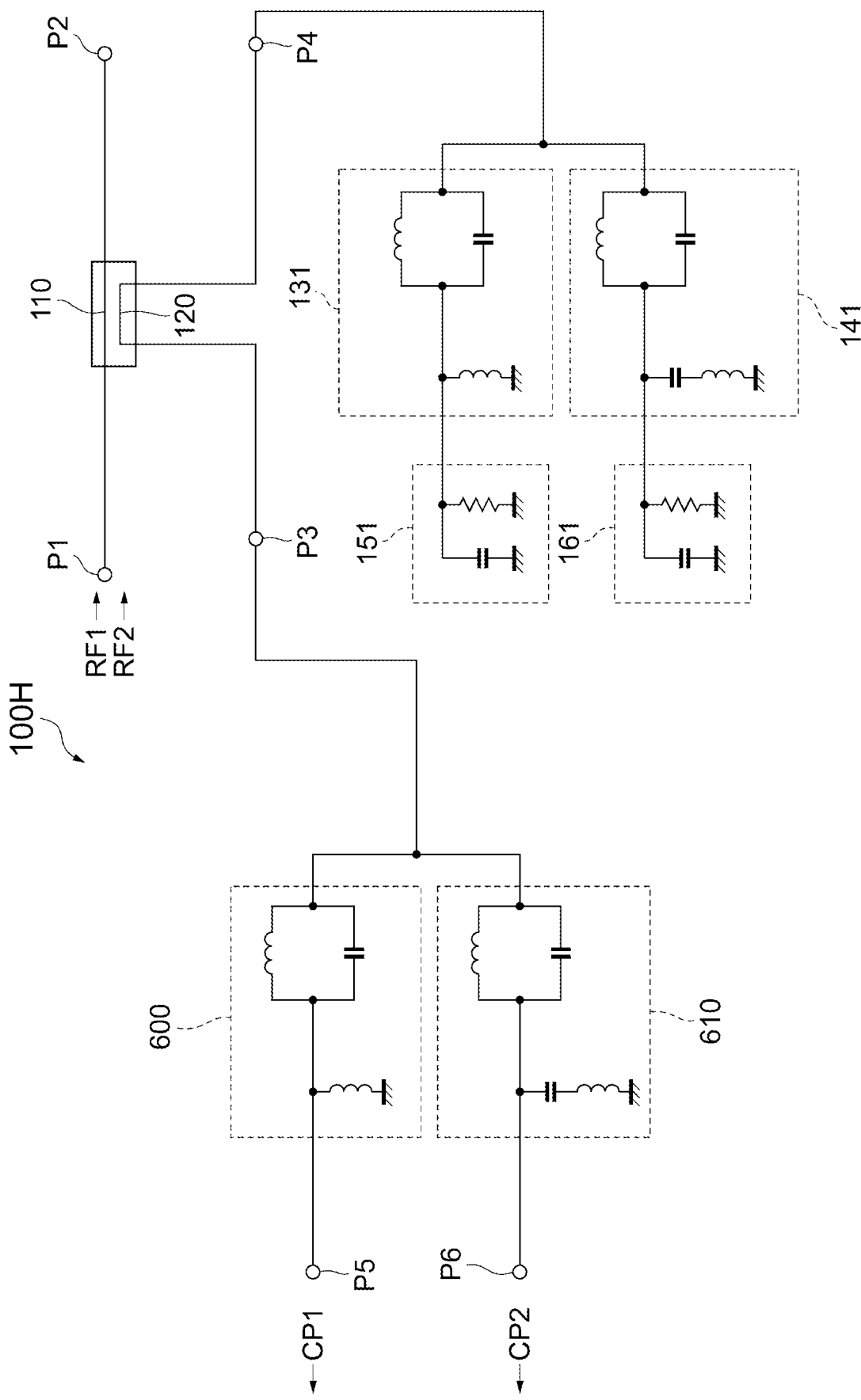
FIG. 13 is a block diagram illustrating an example of configuration of a directional coupler according to an eighth embodiment of the present disclosure.

FIG. 13 is a block diagram illustrating an example of configuration of a directional coupler according to an eighth embodiment of the present disclosure. A directional coupler 100H illustrated in FIG. 13 is different from the directional coupler 100D illustrated in FIG. 4 in that signals are distributed depending on frequency bands through filter circuits not only on the port P4 side, but also on the port P3 side.

More specifically, the directional coupler 100H further includes, for example, ports P5 and P6 and the filter circuits 600 and 610.

The port P5 (first output port) is a port to which the high-band coupled signal CP1 is output from the port P3 via the filter circuit 600. On the other hand, the port P6 (second output port) is a port to which the low-band coupled signal CP2 is output from the port P3 via the filter circuit 610.

The filter circuit 600 (third filter circuit) is disposed between the port P3 and the port P5. The filter circuit 600 has frequency characteristics allowing the high-band coupled signal CP1 to pass therethrough and attenuating the low-band coupled signal CP2. On the other hand, the filter circuit 610 (fourth filter circuit) is disposed between the port P3 and the port P6. The filter circuit 610 has frequency characteristics allowing the low-band coupled signal CP2 to pass therethrough and attenuating the high-band coupled signal CP1. Because configurations of the filter circuits 600 and 610 are similar to those of the filter circuits 131 and 141, respectively, detailed description of those configurations is omitted.

Thus, in the directional coupler 100H, the filter circuits 600 and 610 are further disposed on the port P3 side where the coupled signals CP1 and CP2 are output. As a result, the coupled signals CP1 and CP2 can be distributed and output depending on frequency bands.

Figure 14:
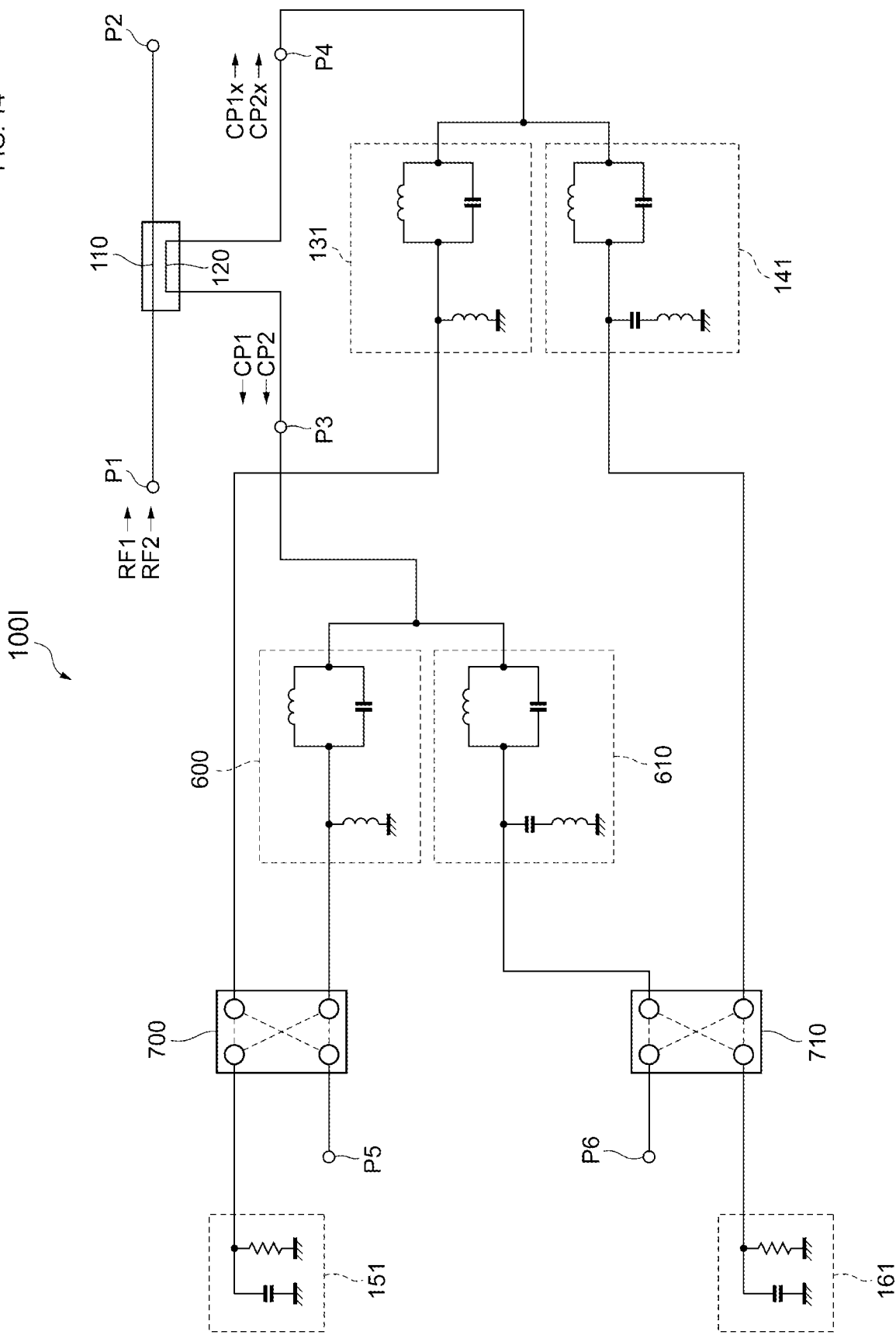
FIG. 14 is a block diagram illustrating an example of configuration of a directional coupler according to a ninth embodiment of the present disclosure.

FIG. 14 is a block diagram illustrating an example of configuration of a directional coupler according to a ninth embodiment of the present disclosure. A directional coupler 100I illustrated in FIG. 14 is different from the directional coupler 100H illustrated in FIG. 13 in that bidirectional signals of a traveling wave and a reflected wave both passing through the main line 110 can be coupled and output.

More specifically, the directional coupler 100I further includes switch circuits 700 and 710 in comparison with the directional coupler 100H.

The switch circuit 700 (third switch circuit) and the switch circuit 710 (fourth switch circuit) are each a switch for connecting each of two inputs to either one of two outputs. More specifically, the switch circuit 700 switches the connection destination of each of the filter circuit 131 and the filter circuit 600 to the termination circuit 151 or the port P5. On the other hand, the switch circuit 710 switches the connection destination of each of the filter circuit 141 and the filter circuit 610 to the termination circuit 161 or the port P6.

In this embodiment, the main line 110 passes the signals RF1 and RF2 from the port P1 to the port P2, and simultaneously passes reflected signals of the signals RF1 and RF2 from the port P2 to the port P1. The coupled signals CP1 and CP2 of the signals RF1 and RF2 are output from the port P3 and coupled signals CP1x (first reflected coupled signal) and CP2x (second reflected coupled signal) of the reflected signals of the signals RF1 and RF2 are output from the port P4. Thus, the directional coupler 100I is able to output the bidirectional coupled signals.

More specifically, in an operation mode (forward mode) in which the coupled signals of the signals RF1 and RF2 are to be output, the switch circuit 700 connects the output of the filter circuit 131 to the termination circuit 151 and connects an output of the filter circuit 600 to the port P5. The switch circuit 710 connects the output of the filter circuit 141 to the termination circuit 161 and connects an output of the filter circuit 610 to the port P6. Therefore, the high-band coupled signal CP1 is output from the port P5 via the port P3, the filter circuit 600, and the switch circuit 700. The port P4 on the termination side is connected to the termination circuit 151 via the filter circuit 131 and the switch circuit 700. In addition, the low-band coupled signal CP2 is output from the port P6 via the port P3, the filter circuit 610, and the switch circuit 710. The port P4 on the termination side is connected to the termination circuit 161 via the filter circuit 141 and the switch circuit 710.

On the other hand, in an operation mode (reverse mode) in which the coupled signals of the reflected signals of the signals RF1 and RF2 are to be output, the switch circuit 700 connects the output of the filter circuit 131 to the port P5 and connects the output of the filter circuit 600 to the termination circuit 151. The switch circuit 710 connects the output of the filter circuit 141 to the port P6 and connects the output of the filter circuit 610 to the termination circuit 161. Therefore, the coupled signal CP1x of the reflected signal in the high band is output from the port P5 via the port P4, the filter circuit 131, and the switch circuit 700. The port P3 on the termination side is connected to the termination circuit 151 via the filter circuit 600 and the switch circuit 700. In addition, the coupled signal CP2x of the reflected signal in the low band is output from the port P6 via the port P4, the filter circuit 141, and the switch circuit 710. The port P3 on the termination side is connected to the termination circuit 161 via the filter circuit 610 and the switch circuit 710.

Thus, in this embodiment, the termination circuits 151 and 161 are shared in both the forward mode and the reverse mode. Accordingly, the termination circuit 151 is used in outputting each of the high-band coupled signals CP1 and CP1x, and the termination circuit 161 is used in outputting each of the low-band coupled signals CP2 and CP2x.

With the configuration described above, the directional coupler 100I can also provide similar advantageous effects to those obtained in the directional coupler 100H. In addition, because of including the switch circuits 700 and 710, the directional coupler 100I is able to output the bidirectional signals.

Figure 15:
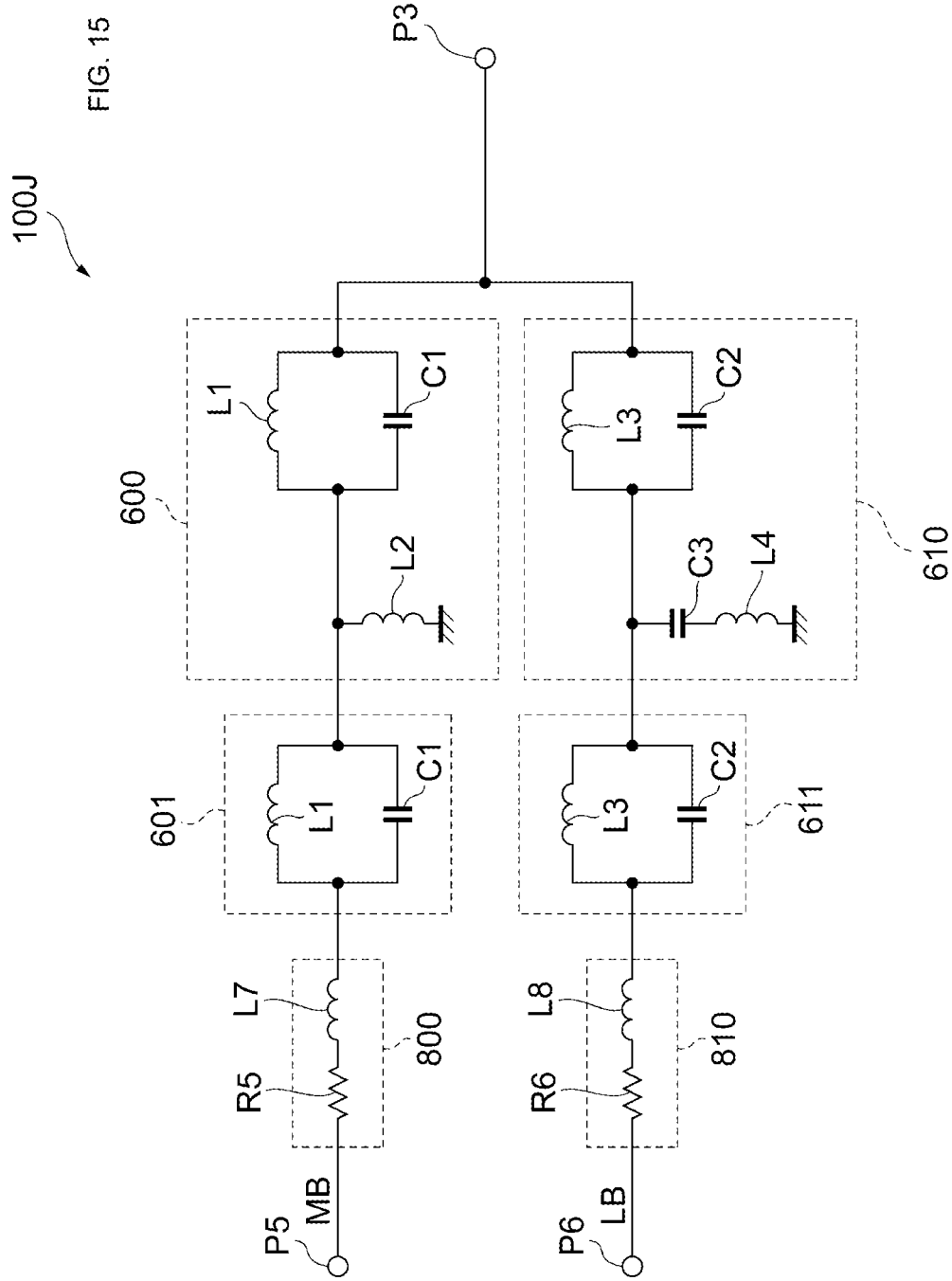
FIG. 15 is a block diagram illustrating an example of configuration of a directional coupler according to a tenth embodiment of the present disclosure.

FIG. 15 is a block diagram illustrating an example of configuration of a directional coupler according to a tenth embodiment of the present disclosure. It is to be noted that FIG. 15 illustrates only the configuration of part of a directional coupler 100J downstream of the port P3. The directional coupler 100J illustrated in FIG. 15 is different from the directional coupler 100H illustrated in FIG. 4 in that loads are disposed in stages subsequent to the filter circuits.

More specifically, the directional coupler 100J includes, for example, filter circuits 600, 601, 610 and 611, and loads 800 and 810. In the following, this embodiment is described on an assumption that the signals in two frequency bands output from the port P3 are signals in the middle band and the low band instead of the high band and the low band.

The filter circuit 601 is disposed in a stage subsequent to the filter circuit 600. The filter circuit 601 is similar to the filter circuit 600 except for not including the inductor L2 among the elements of the filter circuit 600, and it serves as a circuit for attenuating the low-band signal in cooperation with the filter circuit 600.

The filter circuit 611 is disposed in a stage subsequent to the filter circuit 610. The filter circuit 611 is similar to the filter circuit 610 except for not including the inductor L4 and the capacitor C3 among the elements of the filter circuit 610, and it serves as a circuit for attenuating the middle-band signal in cooperation with the filter circuit 610.

The load 800 (first load) is disposed between the filter circuit 601 and the port P5. The load 800 includes, for example, an inductor L7 and a resistance element R5. The inductor L7 and the resistance element R5 are connected in series in a path between the filter circuit 601 and the port P5.

The load 810 (second load) is disposed between the filter circuit 611 and the port P6. The load 810 includes, for example, an inductor L8 and a resistance element R6. The inductor L8 and the resistance element R6 are connected in series in a path between the filter circuit 611 and the port P6.

In this embodiment, the coupling degree between the main line 110 and the sub-line 120 can be controlled by setting the constants of the inductors L7 and L8 and the resistance elements R5 and R6, which are included in the loads 800 and 810, thus adjusting impedances of the loads 800 and 810 depending on frequency bands. More specifically, the impedances of the loads 800 and 810 are adjusted such that a deviation of the coupling degree depending on frequencies is reduced. As a result, when the directional coupler 100J is used to detect RF signals, a deviation between signal levels of the coupled signals is reduced and accuracy in the detection can be improved.

The port P5 and the port P6 may be connected to each other such that the signals in the middle band and the low band may be output from one output port.

Figure 16A:
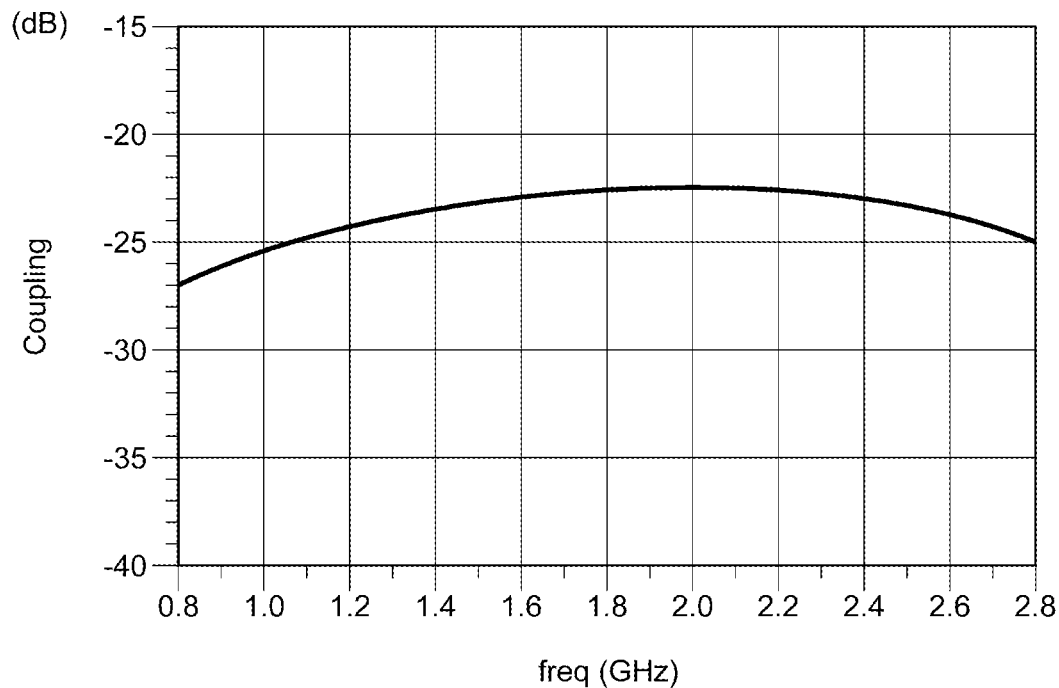
FIG. 16A is a graph depicting an example of a simulation result of a coupling degree in a directional coupler according to a second comparative example.
Figure 16B:
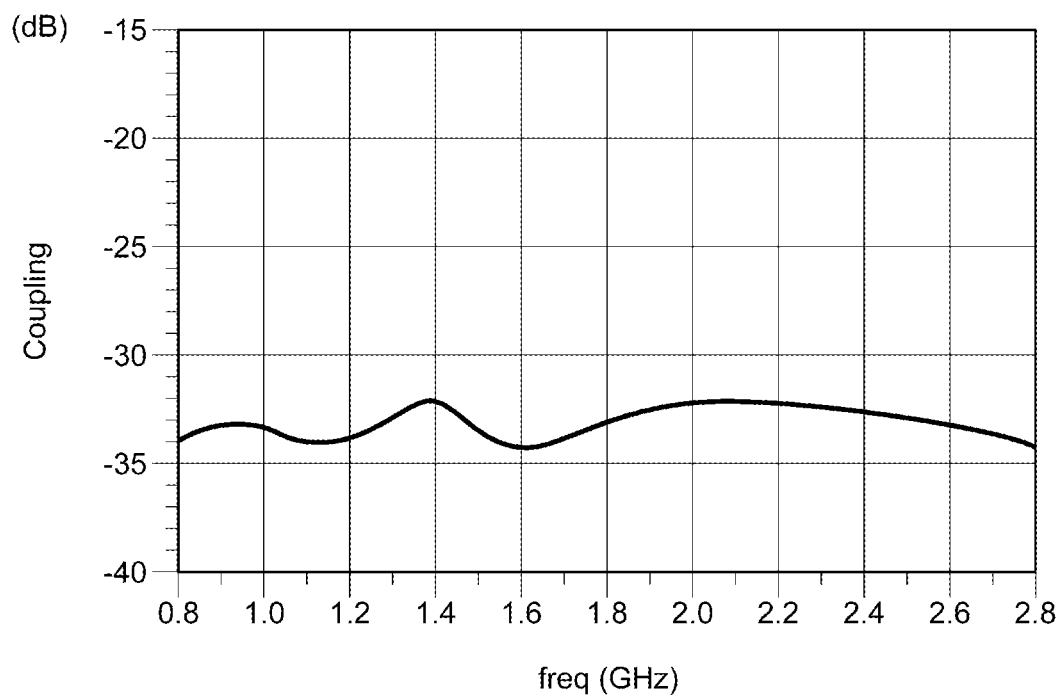
FIG. 16B is a graph depicting an example of a simulation result of a coupling degree in the directional coupler according to the tenth embodiment of the present disclosure.

FIG. 16A is a graph depicting an example of a simulation result of a coupling degree in a directional coupler according to a second comparative example, and FIG. 16B is a graph depicting an example of a simulation result of a coupling degree in the directional coupler according to the tenth embodiment of the present disclosure. Here, the second comparative example has a configuration in which, unlike the directional coupler 100J illustrated in FIG. 15, the filter circuits 600, 601, 610 and 611 and the loads 800 and 810 are not disposed and the coupled signals are directly output from the port P3. In the graphs of FIGS. 16A and 16B, the horizontal axis indicates frequency (GHz), and the vertical axis indicates coupling degree (dB) between the port P1 and the port P3 (i.e., between the output ports to which the port P5 and the port P6 are connected in the directional coupler 100J).

As depicted in FIG. 16A, in the second comparative example, the coupling degree has characteristics represented by a curve moderately curving depending on frequencies. In the frequency range of about 0.8 GHz to 2.8 GHz, for example, the coupling degree varies within a width from about −27 dB to −22 dB.

On the other hand, as depicted in FIG. 16B, in the directional coupler 100J, an average coupling degree is lower than that in the second comparative example, but it has substantially horizontal characteristics. It is seen that the coupling degree in the frequency range of about 0.8 GHz to 2.8 GHz is about −34 dB to −32 dB, and that the coupling degree varies in a smaller width than that in the second comparative example. Thus, the directional coupler 100J is able to suppress the deviation between levels of the coupled signals to be output.

Figure 17:
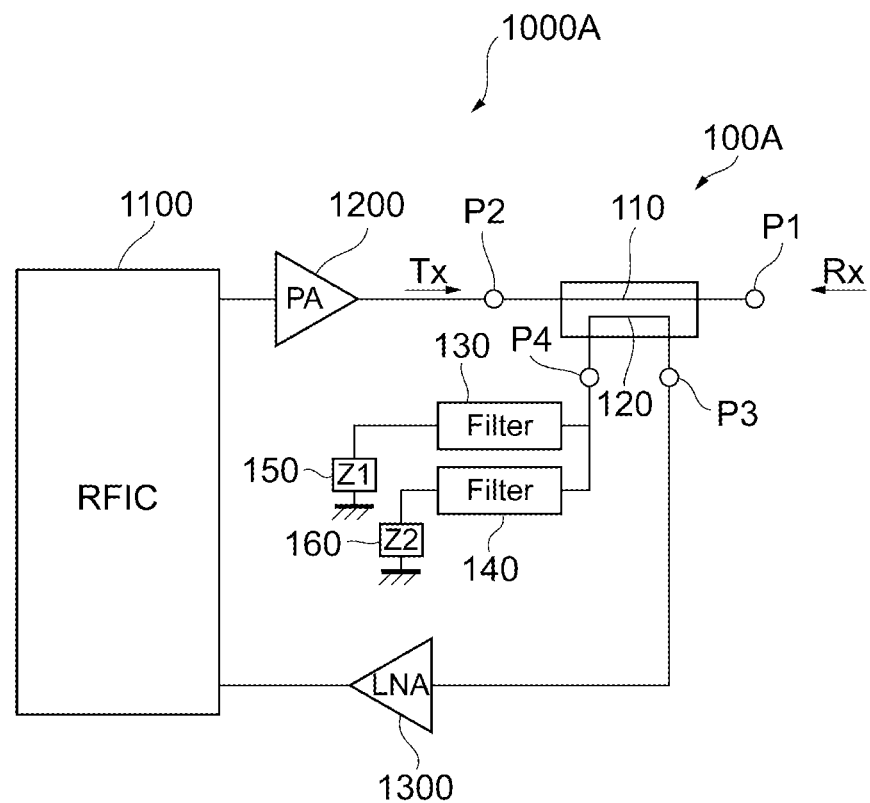
FIG. 17 is a block diagram illustrating an example of configuration of a communication unit including the directional coupler according to the first embodiment of the present disclosure.

FIG. 17 is a block diagram illustrating an example of configuration of a communication unit including the directional coupler according to the first embodiment of the present disclosure. A communication unit 1000A illustrated in FIG. 17 represents an example of configuration in which distribution of a transmitted signal and a received signal in a cellular phone, for example, is implemented using the directional coupler 100A.

More specifically, the communication unit 1000A includes, for example, an RFIC 1100, a power amplifier (PA) 1200, a low noise amplifier (LNA) 1300, and the directional coupler 100A.

The RFIC 1100 is a circuit for executing, for example, production of a transmitted signal Tx that is to be transmitted from an antenna (not illustrated), and processing of received signals Rx that has been received by the antenna.

The power amplifier 1200 amplifies the power of the transmitted signal Tx, which has been produced in the RFIC 1100, to a level necessary for transmission, and then outputs the transmitted signal Tx. The transmitted signal Tx is supplied to the antenna from the port P2 in the directional coupler 100A via the port P1.

The low noise amplifier 1300 amplifies the power of each of the received signals Rx (including first received signal and second received signal) in a plurality of frequency bands, which have been received by the antenna, and then outputs the received signals Rx to the RFIC 1100.

In this embodiment, the directional coupler 100A is used to supply the received signals Rx to the low noise amplifier 1300. More specifically, in the main line 110, the received signals Rx are supplied to the port P1, and the transmitted signal Tx is supplied to the port P2. Moreover, coupled signals of the received signals Rx are output from the port P3. Here, the port P4 is connected, as described above, to the termination circuits 150 and 160 in a way distributed through the filter circuits 130 and 140 depending on frequency bands. Although a coupled signal of the transmitted signal Tx is output from the port P4, the coupled signal of the transmitted signal Tx flows to the ground via the termination circuits 150 and 160. In other words, the termination circuits 150 and 160 function as the termination circuits in outputting the coupled signals of the received signals Rx, and further has the function of causing the coupled signal of the transmitted signal Tx to flow to the ground.

With the communication unit 1000A having the above-described configuration, when the transmitted signal Tx and the received signals Rx are supplied to one main line 110, only signals corresponding to the received signals Rx can be taken out. Thus, the received signals can be taken out without necessarily using a duplexer or a circulator, for example.

Furthermore, since this embodiment includes combinations of the filter circuits 130 and 140 and the termination circuits 150 and 160 in a one-to-one relation to the frequency bands, it is possible to achieve high isolation among the plurality of frequency bands, and to suppress leakage of the transmitted signal to the reception path. As a result, the communication unit 1000A can realize high reception accuracy when signals in the same frequency band are transmitted and received at the same time.

The termination circuits 150 and 160 may be adjusted to have the proper impedance values for frequencies in different frequency bands. Alternatively, one termination circuit 150 may be adjusted to have the proper impedance values for a frequency of the transmitted signal in a predetermined frequency band, and the other termination circuit 160 may be adjusted to have the proper impedance values for a frequency of the received signal in the predetermined frequency band. With the combinations of the filter circuits and the termination circuits that are adjusted to have the proper impedance values for the respective frequencies of the transmitted signal and the received signal as described above, a pass band of each filter circuit can be set to a comparatively narrow band, and high isolation can be realized.

The directional coupler applied to the communication unit 1000A is not limited to the directional coupler 100A, and suitable one of the directional couplers according to the other various embodiments is also applicable. For example, the directional coupler 100H illustrated in FIG. 13 may be applied instead of the directional coupler 100A. In such a case, the communication unit includes two low noise amplifiers, and the ports P5 and P6 illustrated in FIG. 13 are connected to those two low noise amplifiers in a one-to-one relation. As a result, signals in different frequency bands can be received at the same time.

Figure 18:
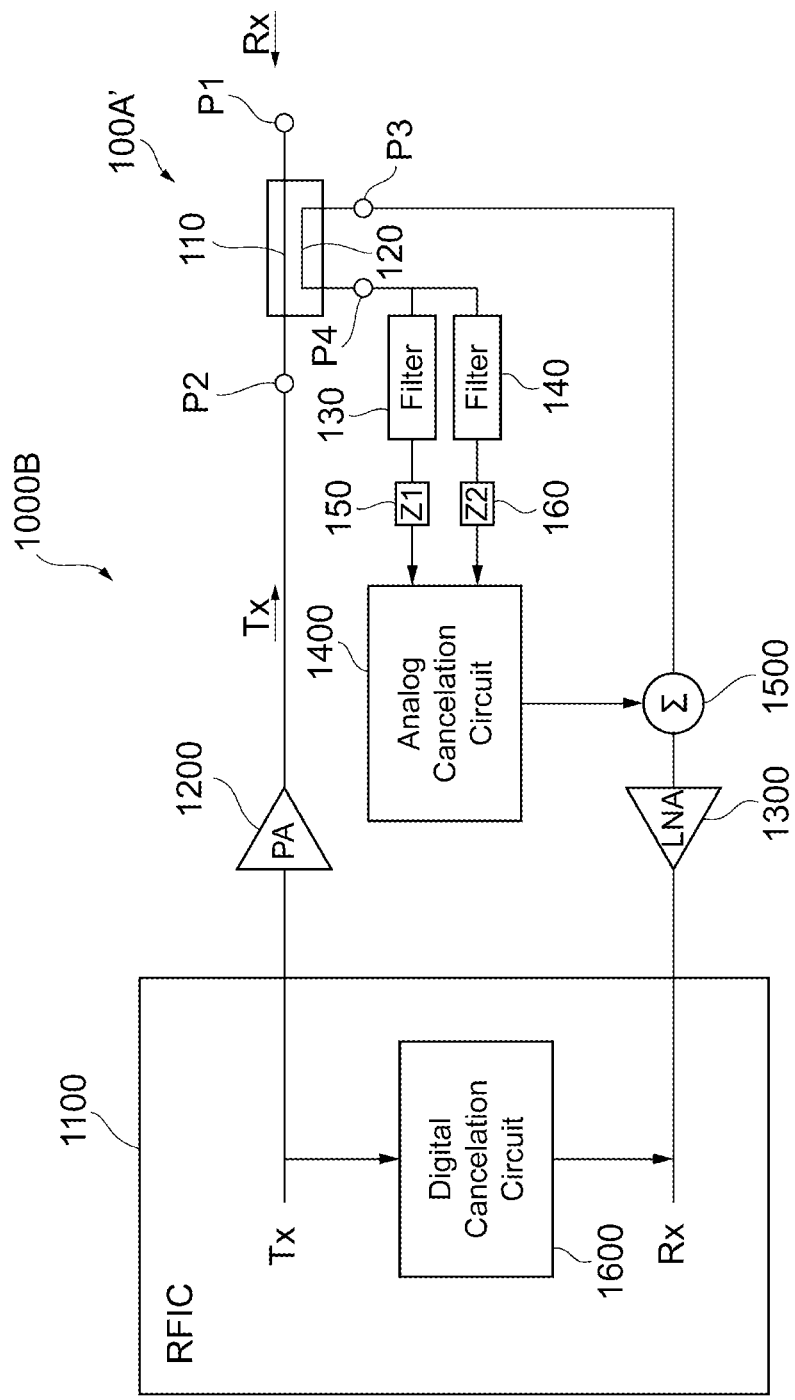
FIG. 18 is a block diagram illustrating an example of configuration of a communication unit including a modification of the directional coupler according to the first embodiment of the present disclosure.

FIG. 18 is a block diagram illustrating an example of configuration of a communication unit including a modification of the directional coupler according to the first embodiment of the present disclosure. A communication unit 1000B illustrated in FIG. 18 represents an example of configuration in which distribution of the transmitted signal and the received signal is implemented, as in the communication unit 1000A illustrated in FIG. 17, using a directional coupler 100A' that is a modification of the directional coupler 100A.

More specifically, the communication unit 1000B is different from the communication unit 1000A in further including an analog cancellation circuit 1400 and an adder 1500. Moreover, the communication unit 1000B includes the directional coupler 100A' substituted for the directional coupler 100A.

In the directional coupler 100A', unlike the directional coupler 100A, respective outputs of the termination circuits 150 and 160 are connected to the analog cancellation circuit 1400 instead of being connected to the ground.

The coupled signal of the transmitted signal Tx is individually supplied to the analog cancellation circuit 1400 from the port P4 via the filter circuits 130 and 140 and the termination circuits 150 and 160. Then, the analog cancellation circuit 1400 produces, from the supplied signal, a signal having a phase that is opposite, when compared in the adder 1500, to a phase of the transmitted signal included in a signal supplied from the port P3 and supplies the produced signal to the adder 1500.

The adder 1500 adds the coupled signal (including a component of the transmitted signal Tx) of each received signal Rx, which is supplied from the port P3, and the signal output from the analog cancellation circuit 1400, and outputs a resulting signal to the low noise amplifier 1300.

In other words, the coupled signal of each received signal Rx output from the port P3 includes the transmitted signal Tx leaking to the port P3 side. In this embodiment, the component of the transmitted signal Tx leaking to the port P3 side and the signal produced by the analog cancellation circuit 1400 and having the phase opposite to that of the transmitted signal Tx cancel each other in the adder 1500. Thus, the component of the transmitted signal Tx included in the coupled signal of the received signal Rx can be removed.

With the configuration described above, the communication unit 1000B can remove the component of the transmitted signal Tx leaking to the reception circuit by utilizing the coupled signal of the transmitted signal Tx, which is output from the port P4. Accordingly, the communication unit 1000B can provide higher reception accuracy than the communication unit 1000A.

The RFIC 1100 may include a digital cancellation circuit 1600, as illustrated in FIG. 18, such that the component of the transmitted signal included in the received signal after being amplified is further canceled through digital processing carried out by the digital cancellation circuit 1600.

Furthermore, in FIG. 18, respective outputs of the termination circuits 150 and 160 may be combined into one output and supplied to the analog cancellation circuit 1400 instead of supplying the coupled signal of the transmitted signal through separated paths from the termination circuits 150 and 160 to the analog cancellation circuit 1400.

The analog cancellation circuit 1400 may control a level of the transmitted signal supplied to the adder 1500 to become substantially the same as that of the transmitted signal included in the received signal supplied to the adder 1500 from the port P3, and then may supply the controlled signal to the adder 1500.

The exemplary embodiments of the present disclosure have been described above. Each of the directional couplers 100A (100A') to 100I includes the main line 110 through which the signals RF1 and RF2 pass from the port P1 to the port P2, the sub-line 120 electromagnetically coupled to the main line 110 and having the port P3 and the port P4, the port P3 outputting the coupled signal CP1 corresponding to the signal RF1 and the coupled signal CP2 corresponding to the signal RF2, the termination circuit 150 connected to the port P4 and used in outputting the coupled signal CP1, the termination circuit 160 connected to the port P4 and used in outputting the coupled signal CP2, and the filter circuit 130 disposed between the port P4 and the termination circuit 150, wherein the filter circuit 130 has the frequency characteristics allowing the coupled signal CP1 to pass therethrough and attenuating the coupled signal CP2. Hence the coupled signals CP1 and CP2 can be distributed depending on frequencies without necessarily resorting to turning-on/off of switches. Accordingly, the impedance values Z1 and Z2 of the termination circuits 150 and 160 can be set to the proper impedance values depending on frequencies. As a result, even when the signals in the plurality of different frequency bands are supplied to the main line 110 at the same time, the directivity of each of the signals in the plurality of frequency bands can be improved.

Each of the directional couplers 100A (100A') and 100D to 100J further includes the filter circuit 140 disposed between the port P4 and the termination circuit 160 and having the frequency characteristics allowing the coupled signal CP2 to pass therethrough and attenuating the coupled signal CP1. Hence the coupled signals CP1 and CP2 can be distributed depending on frequencies. As a result, the directivity of each of the signals in the plurality of frequency bands can be improved.

Furthermore, in each of the directional couplers 100D, 100E, and 100H to 100J, the filter circuit 131 includes the LC parallel resonance circuit having the resonant frequency that falls within the frequency band of the low band, and the filter circuit 141 includes the LC parallel resonance circuit having the resonant frequency that falls within the frequency band of the high band. Accordingly, since the filter circuits 131 and 141 have very high impedances for the signals in the low band and the high band, respectively, the coupled signals CP2 and CP1 in the low band and the high band can be attenuated.

The directional coupler 100E further includes the termination circuits 152 and 162 each connected to the port P4, and the switch circuits 400 and 410. The main line 110 passes the signals RF3 and RF4 in the other different frequency bands therethrough from the port P1 to the port P2, and the sub-line 120 further outputs the coupled signal CP3 corresponding to the signal RF3 and the coupled signal CP4 corresponding to the signal RF4 from the port P3. The switch circuit 400 supplies the coupled signal CP1 to the termination circuit 151 and the coupled signal CP3 to the termination circuit 152, and the switch circuit 410 supplies the coupled signal CP2 to the termination circuit 161 and the coupled signal CP4 to the termination circuit 162. The termination circuit 152 is used in outputting the coupled signal CP3, and the termination circuit 162 is used in outputting the coupled signal CP4. Accordingly, the directional coupler 100E can more finely set the impedance values of the termination circuits 151, 152, 161 and 162 than the directional coupler 100D. As a result, the directivity in each frequency band can be further improved in the directional coupler 100E.

Each of the directional couplers 100F and 100G further includes the termination circuit 550 connected to the port P4, and the filter circuits 520 and 530 both disposed between the port P4 and the termination circuit 550. The main line 110 passes the signal RF5 in the other different frequency band therethrough from the port P1 to the port P2, and the sub-line 120 further outputs the coupled signal CP5 corresponding to the signal in the relevant frequency band from the port P3. The filter circuits 500 and 510 have the frequency characteristics allowing the coupled signal CP1 to pass therethrough and attenuating the coupled signals CP2 and CP5 in cooperation with each other, the filter circuit 540 has the frequency characteristics allowing the coupled signal CP2 to pass therethrough and attenuating the coupled signals CP1 and CP5, and the filter circuits 520 and 530 have the frequency characteristics allowing the coupled signal CP5 to pass therethrough and attenuating the coupled signals CP1 and CP2 in cooperation with each other. Hence the coupled signals CP1, CP2 and CP5 can be distributed depending on frequencies without necessarily resorting to turning-on/off of switches. According to the directional couplers 100F and 100G, therefore, the directivity of the signal in each of three frequency bands can be further improved.

Each of the directional couplers 100H to 100J further includes the port P5 from which the coupled signal CP1 is output, the port P6 from which the coupled signal CP2 is output, the filter circuit 600 disposed between the port P3 and the port P5 and having the frequency characteristics allowing the coupled signal CP1 to pass therethrough and attenuating the coupled signal CP2, and the filter circuit 610 disposed between the port P3 and the port P6 and having the frequency characteristics allowing the coupled signal CP2 to pass therethrough and attenuating the coupled signal CP1. Hence the coupled signals CP1 and CP2 can be distributed depending on frequency bands and then output.

The directional coupler 100J further includes the load 800 disposed between the filter circuit 600 and the port P5, and the load 810 disposed between the filter circuit 610 and the port P6, wherein the coupling degree between the main line 110 and the sub-line 120 is adjusted by the load 800 and the load 810. Hence a deviation of the coupling degree depending on frequencies can be reduced. As a result, when the directional coupler 100J is used to detect RF signals, accuracy in the detection can be improved.

The directional coupler 100I further includes the switch circuit 700 switching the connection destination of each of the filter circuit 131 and the filter circuit 600 to the termination circuit 151 or the port P5, and the switch circuit 710 switching the connection destination of each of the filter circuit 141 and the filter circuit 610 to the termination circuit 161 or the port P6. The port P4 outputs the coupled signal CP1x corresponding to the reflected signal of the signal RF1 and the coupled signal CP2x corresponding to the reflected signal of the signal RF2. As a result, the directional coupler 100I is able to output bidirectional signals of a traveling wave and a reflected wave.

In the directional coupler 100C, the filter circuit 140 is not disposed, and the termination circuit 310 is used in outputting both the coupled signals CP1 and CP2. As a result, the directional coupler 100C can be constituted using a smaller number of elements than that used in the directional coupler 100A.

Each of the communication unit 1000A and 1000B includes the directional coupler 100A or 100A' and the low noise amplifier 1300. Each of the signal RF1 and the signal RF2 contains the received signal Rx having been received by the antenna, and the coupled signals CP1 and CP2 are both supplied to the low noise amplifier 1300. Thus, when the transmitted signal Tx and the received signals Rx are supplied to one main line 110, signals corresponding to the received signals Rx can be output from the port P3. According to the communication units 1000A and 1000B, therefore, the received signal can be taken out without necessarily using a duplexer or a circulator. In addition, since a combination of the filter circuit and the termination circuit is disposed for each frequency band, high isolation can be achieved among the plurality of frequency bands. As a result, high reception accuracy can be realized when signals in the same frequency band are transmitted and received at the same time.

It is to be noted that the above-described embodiments are merely illustrative with intent to make easier understanding of the present disclosure, and they should not be construed as limiting the present disclosure. The present disclosure can be modified and/or improved without departing from the gist of the disclosure, and the present disclosure includes equivalents to the matters disclosed in the present disclosure as well. In other words, modifications resulting from changing designs of the embodiments as appropriate by those skilled in the art are also included in the scope of the present disclosure insofar as having the features of the present disclosure. For instance, individual constituent elements in the embodiments, and layouts, materials, conditions, shapes, sizes, etc. of those constituent elements are not limited to the illustrated ones, and they may be changed as appropriate. In addition, the constituent elements in the embodiments may be combined with each other insofar as being technically feasible and resulting combinations of the constituent elements are also included in the scope of the present disclosure insofar as having the features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A directional coupler comprising:
   a first port and a second port;
   a main line connecting the first port to the second port and which is configured to pass a first signal in a first frequency band and a second signal in a second frequency band pass;
   a third port and a fourth port, the third port being configured to output a first coupled signal corresponding to the first signal and to output a second coupled signal corresponding to the second signal;
   a sub-line electromagnetically coupled to the main line and connecting the third port to the fourth port;
   a first termination circuit connected to the fourth port;
   a second termination circuit connected to the fourth port; and
   a first filter circuit disposed between the fourth port and the first termination circuit,
   wherein the first filter circuit has a pass band corresponding to a frequency of the first coupled signal and an attenuation band corresponding to a frequency of the second coupled signal.

2. The directional coupler according to claim 1, further comprising a second filter circuit disposed between the fourth port and the second termination circuit,
   wherein the second filter circuit has a pass band corresponding to the frequency of the second coupled signal and an attenuation band corresponding to the frequency of the first coupled signal.

3. The directional coupler according to claim 2, wherein:
   the first filter circuit comprises an LC parallel resonance circuit having a resonant frequency that falls within the second frequency band, and
   the second filter circuit comprises an LC parallel resonance circuit having a resonant frequency that falls within the first frequency band.

4. The directional coupler according to claim 3, further comprising:
   a third termination circuit and a fourth termination circuit, the third and fourth termination circuits each connected to the fourth port; and
   a first switch circuit and a second switch circuit, wherein:
   the main line is further configured to pass a third signal in a third frequency band and a fourth signal in a fourth frequency band,
   the third port is further configured to output a third coupled signal corresponding to the third signal and to output a fourth coupled signal corresponding to the fourth signal,
   the first switch circuit is configured to selectively supply the first coupled signal to the first termination circuit and the third coupled signal to the third termination circuit, and
   the second switch circuit is configured to selectively supply the second coupled signal to the second termination circuit and the fourth coupled signal to the fourth termination circuit.

5. The directional coupler according to claim 3, further comprising:
   a first output port configured to output the first coupled signal;
   a second output port configured to output the second coupled signal;
   a third filter circuit disposed between the third port and the first output port, and having a pass band corresponding to the frequency of the first coupled signal and an attenuation band corresponding to the frequency of the second coupled signal; and
   a fourth filter circuit disposed between the third port and the second output port, and having a pass band corresponding to the frequency of the second coupled signal and an attenuation band corresponding to the frequency of the first coupled signal.

6. A communication unit comprising:
the directional coupler according to claim 3; and
a low noise amplifier, wherein:
the first signal and the second signal each comprise signals received by an antenna, and
the low noise amplifier is configured to receive the first coupled signal and the second coupled signal.

7. The directional coupler according to claim 2, further comprising:
a third termination circuit and a fourth termination circuit, the third and fourth termination circuits each connected to the fourth port; and
a first switch circuit and a second switch circuit, wherein:
the main line is further configured to pass a third signal in a third frequency band and a fourth signal in a fourth frequency band,
the third port is further configured to output a third coupled signal corresponding to the third signal and to output a fourth coupled signal corresponding to the fourth signal,
the first switch circuit is configured to selectively supply the first coupled signal to the first termination circuit and the third coupled signal to the third termination circuit, and
the second switch circuit is configured to selectively supply the second coupled signal to the second termination circuit and the fourth coupled signal to the fourth termination circuit.

8. The directional coupler according to claim 7, wherein the first switch is disposed between the first filter circuit and the first and third termination circuits, and the second switch is disposed between the second filter circuit and the second and fourth termination circuits.

9. The directional coupler according to claim 7, further comprising:
a first output port configured to output the first coupled signal;
a second output port configured to output the second coupled signal;
a third filter circuit disposed between the third port and the first output port, and having a pass band corresponding to the frequency of the first coupled signal and an attenuation band corresponding to the frequency of the second coupled signal; and
a fourth filter circuit disposed between the third port and the second output port, and having a pass band corresponding to the frequency of the second coupled signal and an attenuation band corresponding to the frequency of the first coupled signal.

10. A communication unit comprising:
the directional coupler according to claim 7; and
a low noise amplifier, wherein:
the first signal and the second signal each comprise signals received by an antenna, and
the low noise amplifier is configured to receive the first coupled signal and the second coupled signal.

11. The directional coupler according to claim 2, further comprising:
a third termination circuit connected to the fourth port; and
a third filter circuit disposed between the fourth port and the third termination circuit, wherein:
the main line is further configured to pass a third signal in a third frequency band,
the third port is further configured to output a third coupled signal corresponding to the third signal from the third port,
the attenuation band of the first filter circuit further corresponds to a frequency of the third coupled signal,
the attenuation band of the second filter circuit further corresponds to the frequency of the third coupled signal, and
the third filter circuit has a pass band corresponding to the frequency of the third coupled signal and an attenuation band corresponding to the frequencies of the first coupled signal and the second coupled signal.

12. The directional coupler according to claim 2, further comprising:
a first output port configured to output the first coupled signal;
a second output port configured to output the second coupled signal;
a third filter circuit disposed between the third port and the first output port, and having a pass band corresponding to the frequency of the first coupled signal and an attenuation band corresponding to the frequency of the second coupled signal; and
a fourth filter circuit disposed between the third port and the second output port, and having a pass band corresponding to the frequency of the second coupled signal and an attenuation band corresponding to the frequency of the first coupled signal.

13. The directional coupler according to claim 12, further comprising:
a first load disposed between the third filter circuit and the first output port; and
a second load disposed between the fourth filter circuit and the second output port,
wherein a degree of coupling between the main line and the sub-line depends on the first load and the second load.

14. The directional coupler according to claim 12, further comprising:
a third switch circuit configured to selectively connect each of the first filter circuit and the third filter circuit to one of the first termination circuit and the first output port; and
a fourth switch circuit configured to selectively connect each of the second filter circuit and the fourth filter circuit to one of the second termination circuit and the second output port, wherein:
the fourth port is configured to output a first reflected coupled signal corresponding to a reflected signal of the first signal and to output a second reflected coupled signal corresponding to a reflected signal of the second signal,
when the directional coupler is configured to output the first coupled signal or the second coupled signal, the third switch circuit connects an output of the first filter circuit to the first termination circuit and an output of the third filter circuit to the first output port, and the fourth switch circuit connects an output of the second filter circuit to the second termination circuit and an output of the fourth filter circuit to the second output port, and
when the directional coupler is configured to output the first reflected coupled signal or the second reflected coupled signal, the third switch circuit connects the output of the first filter circuit to the first output port and the output of the third filter circuit to the first termination circuit, and the fourth switch circuit connects the output of the second filter circuit to the second output port and the output of the fourth filter circuit to the second termination circuit.

15. A communication unit comprising:
the directional coupler according to claim 2; and
a low noise amplifier, wherein:
the first signal and the second signal each comprise signals received by an antenna, and
the low noise amplifier is configured to receive the first coupled signal and the second coupled signal.

16. The directional coupler according to claim 1, wherein the first filter circuit is a multiplexer.

17. The directional coupler according to claim 1, wherein the frequency of the first coupled signal is greater than the frequency of the second coupled signal.

18. A communication unit comprising:
the directional coupler according to claim 1; and
a low noise amplifier, wherein:
the first signal and the second signal each comprise signals received by an antenna, and
the low noise amplifier is configured to receive the first coupled signal and the second coupled signal.

\* \* \* \* \*